United States Patent
Wayne et al.

(10) Patent No.: US 11,443,261 B2
(45) Date of Patent: *Sep. 13, 2022

(54) AUTOMATED SOLAR COLLECTOR INSTALLATION DESIGN INCLUDING VERSION MANAGEMENT

(71) Applicant: SUNPOWER CORPORATION, San Jose, CA (US)

(72) Inventors: Gary Wayne, Berkeley, CA (US); Alexander Frumkin, San Rafael, CA (US); Michael Zaydman, San Rafael, CA (US); Scott Lehman, Martinez, CA (US); Jules Brenner, Novato, CA (US)

(73) Assignee: SUNPOWER CORPORATION, San Jose, CA (US)

( * ) Notice: Subject to any disclaimer, the term of this patent is extended or adjusted under 35 U.S.C. 154(b) by 206 days.

This patent is subject to a terminal disclaimer.

(21) Appl. No.: 16/775,693

(22) Filed: Jan. 29, 2020

(65) Prior Publication Data

US 2020/0167706 A1    May 28, 2020

Related U.S. Application Data

(60) Continuation of application No. 15/448,107, filed on Mar. 2, 2017, now Pat. No. 10,592,834, which is a
(Continued)

(51) Int. Cl.
*G06Q 10/00* (2012.01)
*G06Q 10/06* (2012.01)
(Continued)

(52) U.S. Cl.
CPC ..... *G06Q 10/06313* (2013.01); *G06F 16/219* (2019.01); *G06F 30/13* (2020.01);
(Continued)

(58) Field of Classification Search
CPC ............ G06Q 10/06313; G06Q 10/067; G06Q 50/165; G06F 16/219; G06F 30/13; F24S 2201/00; Y02B 10/20
See application file for complete search history.

(56) References Cited

U.S. PATENT DOCUMENTS

| 4,079,724 A | 3/1978 | Zwillinger |
| 4,137,897 A | 2/1979 | Moore |

(Continued)

FOREIGN PATENT DOCUMENTS

| CN | 1248070 | 3/2000 |
| EP | 0 856 804 A2 | 1/1998 |

(Continued)

OTHER PUBLICATIONS

Carnduff et al., *Configuration management in evolutionary engineering design using versioning and integrity constraints*, Advances in Engineering Software, vol. 35 (2004), p. 161-177.

(Continued)

*Primary Examiner* — Gabrielle A McCormick
(74) *Attorney, Agent, or Firm* — Oblon, McClelland, Maier & Neustadt, L.L.P.

(57) ABSTRACT

Embodiments may include systems and methods to create and edit a representation of a worksite, to create various data objects, to classify such objects as various types of predefined "features" with attendant properties and layout constraints. As part of or in addition to classification, an embodiment may include systems and methods to create, associate, and edit intrinsic and extrinsic properties to these objects. A design engine may apply of design rules to the features described above to generate one or more solar collectors installation design alternatives, including generation of on-screen and/or paper representations of the physical layout or arrangement of the one or more design alternatives. Some embodiments may provide viewing, creating, (Continued)

and manipulating of multiple versions of a solar collector layout design for a particular installation worksite. The use of versions may allow analysis of alternative layouts, alternative feature classifications, and cost and performance data corresponding to alternative design choices. Version summary information providing a representative comparison between versions across a number of dimensions may be provided.

20 Claims, 25 Drawing Sheets

Related U.S. Application Data division of application No. 12/708,486, filed on Feb. 18, 2010, now abandoned.

(60) Provisional application No. 61/154,344, filed on Feb. 20, 2009.

(51) Int. Cl.
    *G06F 16/21*         (2019.01)
    *G06F 30/13*         (2020.01)
    *G06Q 50/16*         (2012.01)

(52) U.S. Cl.
    CPC ......... *G06Q 10/067* (2013.01); *G06Q 50/165* (2013.01); *F24S 2201/00* (2018.05); *Y02B 10/20* (2013.01)

(56) References Cited

U.S. PATENT DOCUMENTS

| | | | |
|---|---|---|---|
| 4,322,571 A | 3/1982 | Stanbery | |
| 4,700,371 A | 10/1987 | Forsyth et al. | |
| 4,831,546 A | 5/1989 | Mitsuta et al. | |
| 4,912,657 A | 3/1990 | Saxton et al. | |
| 4,964,060 A | 10/1990 | Hartsog | |
| 5,031,111 A | 7/1991 | Chao et al. | |
| 5,225,987 A | 7/1993 | Thompson | |
| 5,276,871 A * | 1/1994 | Howarth | H04L 29/06 |
| 5,396,433 A | 3/1995 | Kosugi | |
| 5,490,323 A | 2/1996 | Asano et al. | |
| 5,712,964 A * | 1/1998 | Kamada | G06T 13/00 |
| | | | 345/418 |
| 5,768,146 A | 6/1998 | Jassowski | |
| 5,806,078 A * | 9/1998 | Hug | G06F 40/197 |
| | | | 715/205 |
| 5,835,922 A * | 11/1998 | Shima | G06F 40/166 |
| | | | 715/209 |
| 5,864,875 A * | 1/1999 | Van Huben | G06F 30/00 |
| 5,905,657 A * | 5/1999 | Celniker | G01V 1/282 |
| | | | 703/5 |
| 5,913,029 A * | 6/1999 | Shostak | G06F 16/26 |
| | | | 709/203 |
| 6,056,556 A | 5/2000 | Braun et al. | |
| 6,111,188 A | 8/2000 | Kurokami et al. | |
| 6,115,034 A | 9/2000 | Tanaka et al. | |
| 6,115,719 A * | 9/2000 | Purdy | G06F 9/465 |
| 6,226,788 B1 * | 5/2001 | Schoening | H04L 41/0213 |
| | | | 709/203 |
| 6,343,285 B1 | 1/2002 | Tanaka et al. | |
| 6,510,730 B1 * | 1/2003 | Phan | G03F 1/36 |
| | | | 430/30 |
| 6,534,702 B1 | 3/2003 | Makita et al. | |
| 6,542,855 B1 * | 4/2003 | Pontius | G06F 11/3457 |
| | | | 702/186 |
| 6,546,535 B1 * | 4/2003 | Nagao | G06F 30/13 |
| | | | 716/120 |
| 6,662,144 B1 | 12/2003 | Normann et al. | |
| 6,999,907 B2 | 2/2006 | Smith | |
| 7,054,885 B1 * | 5/2006 | Hoffman | G06F 8/71 |
| 7,395,191 B2 | 7/2008 | Detwiler et al. | |
| 8,224,628 B2 | 7/2012 | Reghetti et al. | |
| 8,862,639 B1 * | 10/2014 | Rao | G06F 16/219 |
| | | | 707/813 |
| 2001/0013004 A1 * | 8/2001 | Haris | G06Q 10/103 |
| | | | 705/301 |
| 2002/0129001 A1 | 9/2002 | Levkoff et al. | |
| 2003/0131018 A1 * | 7/2003 | Godoy | G06Q 10/10 |
| 2004/0128230 A1 * | 7/2004 | Oppenheimer | G06Q 40/00 |
| | | | 705/38 |
| 2005/0086384 A1 * | 4/2005 | Ernst | H04L 67/1095 |
| | | | 709/248 |
| 2005/0131964 A1 * | 6/2005 | Saxena | G06F 16/219 |
| 2006/0075058 A1 * | 4/2006 | Fujiki | G06F 16/27 |
| | | | 709/213 |
| 2006/0137736 A1 | 6/2006 | Nishitani et al. | |
| 2006/0253214 A1 * | 11/2006 | Gross | G06Q 30/0601 |
| | | | 700/97 |
| 2007/0089087 A1 * | 4/2007 | Connor | G06F 30/18 |
| | | | 717/105 |
| 2007/0186160 A1 * | 8/2007 | McArdle | G06F 30/00 |
| | | | 715/700 |
| 2008/0015719 A1 * | 1/2008 | Ziolek | G06F 30/15 |
| | | | 700/97 |
| 2008/0098000 A1 * | 4/2008 | Koretz | G06Q 30/06 |
| 2008/0162380 A1 | 7/2008 | Suga et al. | |
| 2008/0222110 A1 | 9/2008 | Hayashi | |
| 2009/0072078 A1 | 3/2009 | Choi et al. | |
| 2009/0223508 A1 | 9/2009 | Hinderling | |
| 2009/0307277 A1 * | 12/2009 | Grubov | G06F 11/3672 |
| 2009/0308566 A1 | 12/2009 | Simka | |
| 2010/0018569 A1 | 1/2010 | Mitchell et al. | |
| 2010/0185595 A1 * | 7/2010 | Gopalakrishnan | G06F 16/219 |
| | | | 707/695 |
| 2010/0218757 A1 | 9/2010 | Nielsen | |
| 2010/0218806 A1 | 9/2010 | Arab et al. | |

FOREIGN PATENT DOCUMENTS

| | | |
|---|---|---|
| EP | 0 854 521 A2 | 7/1998 |
| EP | 0 917 210 A2 | 5/1999 |
| EP | 0 973 106 A2 | 1/2000 |
| EP | 0973106 A2 | 1/2000 |
| EP | 1 619 610 A1 | 1/2006 |
| JP | 10-270739 | 10/1998 |
| JP | 10-275174 | 10/1998 |
| JP | 10-275188 | 10/1998 |
| JP | 11-141081 | 5/1999 |
| JP | 2000-029926 | 1/2000 |
| JP | 3586082 | 11/2004 |
| JP | 3625379 | 3/2005 |
| JP | 3630967 | 3/2005 |
| JP | 2006-185367 | 7/2006 |
| JP | 2006-301699 | 11/2006 |
| JP | 2008-166598 | 7/2008 |
| JP | 2008-217710 | 9/2008 |

OTHER PUBLICATIONS

Miles et al., *Versioning and configuration management in design using CAD and complex wrapped objects*, Artificial Intelligence in Engineering, vol. 14 (2000), p. 249-260.

Mellit et al., *Artificial intelligence techniques for photovoltaic applications: A review*, Progress in Energy and Combustion Science, vol. 34 (2008) p. 574-632.

International Search Report and Written Opinion of the International Searching Authority in International Patent Application No. PCT/US2010/023065, dated Apr. 27, 2010.

International Search Report and Written Opinion of the International Searching Authority in International Patent Application No. PCT/US2010/023061, dated May 20, 2010.

Invitation to Pay Additional Search Fees in counterpart International Patent Application No. PCT/US2010/023079, dated May 7, 2010.

Invitation to Pay Additional Search Fees in International Patent Application No. PCT/US2010/023077, dated May 7, 2010.

(56) References Cited

OTHER PUBLICATIONS

Alyson-Kathleen Riley, *Raycing With the Sun*, Minnesota Technolog, A Publication of the Institute of Technology, IT Board of Publications, University of Minnesota.
Christensen et al., "Orienting the Neighborhood: A Subdivision Energy Analysis Tool," National Renewable Energy Laboratory, Conference Paper NREL/CP-550-43341, Jul. 2008.
Eastman, "Integration of Design and Construction Knowledge," Integrated Construction Information, 1995, pp. 171-191, E&FN Spon.
Office Action received in U.S. Appl. No. 12/708,485, dated Jul. 3, 2013; in 34 pages.
Office Action received in U.S. Appl. No. 12/708,498, dated Apr. 4, 2013, in 20 pages.
Office Action received in U.S. Appl. No. 13/730,580, dated May 28, 2013; in 29 pages.
Riley, "Raycing with the Sun," Minnesota Technology, A Publication of the Institute of Technology, IT Board of Publications, University of Minnesota [online], May 1996, most recently retrieved on Sep. 10, 2012. Retrieved from the Internet at World Wide Web address, <technolog.it.umn.edu/technology/may96/cover.html>.
Rylatt et al., "GIS-Based Decision Support for Solar Energy Planning in Urban Environments," Computers, Environment and Urban Systems, 2001, pp. 579-603; vol. 25.
Shaviv et al., "Simulations and Knowledge-Based Computer-Aided Architectural Design (CAAD) Systems for Passive and Low Energy Architecture," Energy and Buildings, 1996, pp. 257-269; vol. 23.
Shawal et al., "Development of Expert System as an Evaluation Tool for Photovoltaic Power Supply," National Power and Energy Conference (PECon), 2003, pp. 292-295.
Whyte et al., "From CAD to Virtual Reality: Modeling Approaches, Data Exchange and Interactive 3D Building Design Tools," Automation in Construction, 2000, pp. 43-55; vol. 10.
Yezioro et al., "A Knowledge Based CAAD System for Determining Thermal Comfort Design Strategies," WREC 1996, pp. 132-138.
Office Action received in Japanese Patent Application No. 2011-551104, dated Jun. 4, 2013 (with English-language Translation).
Office Action received in Japanese Patent Application No. 2011-551104, dated Dec. 17, 2013 (with English-language Translation).
Office Action received in Chinese Patent Application No. 201080008364.4, dated Feb. 4, 2013 (with English-language Translation).
Office Action received in Chinese Patent Application No. 201080008364.4, dated Jul. 29, 2013 (with English-language Translation).
Office Action dated Jun. 14, 2018 in European Patent Application No. 10704636.9, 4 pages.
Handbook of air conditioning and refrigeration, SK Wang, SK Wang—2000—academia.edu.

\* cited by examiner

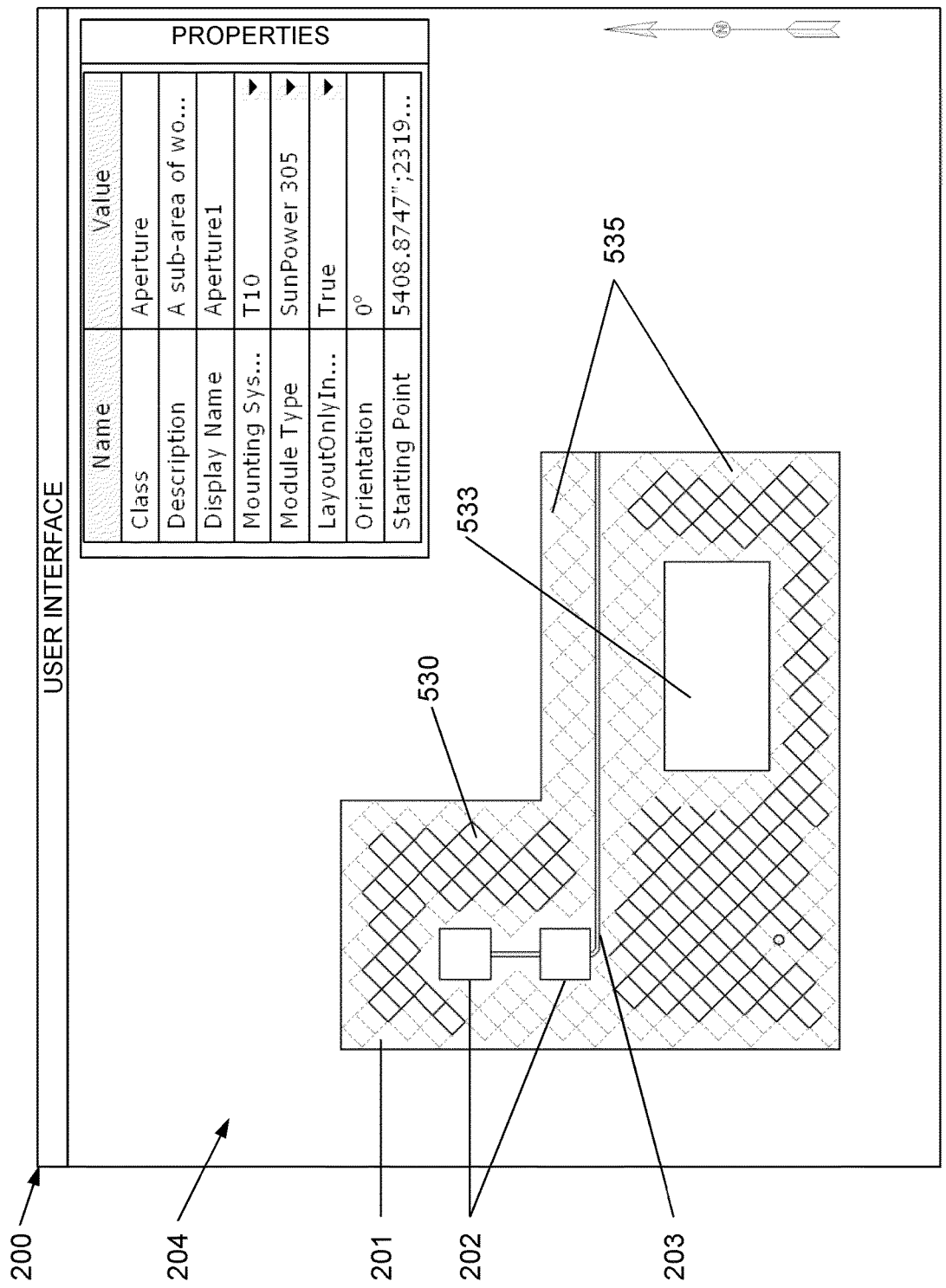

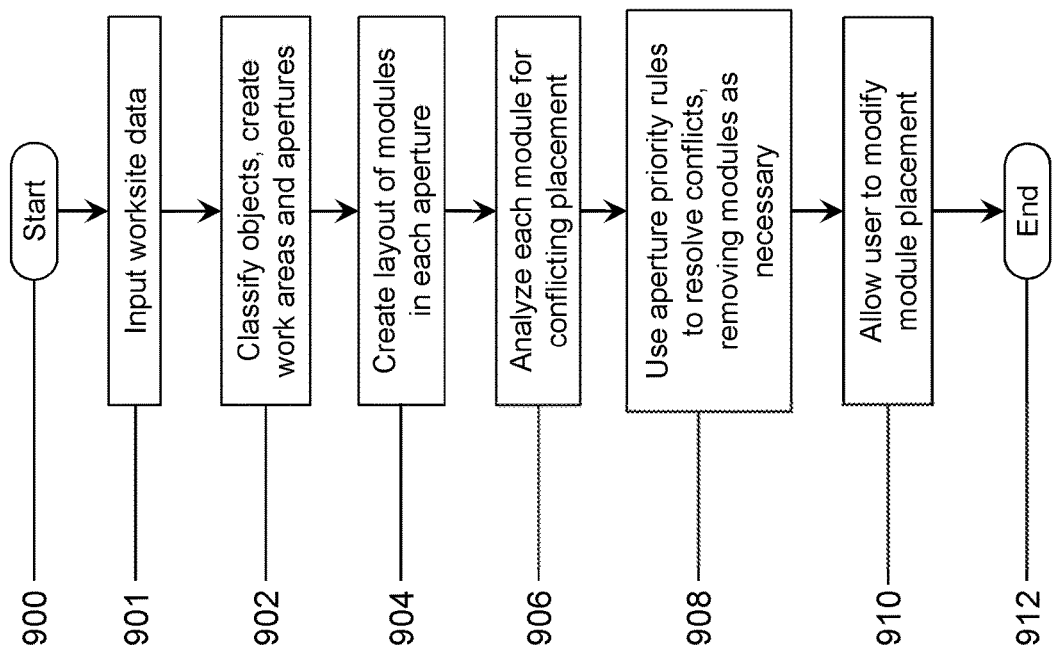

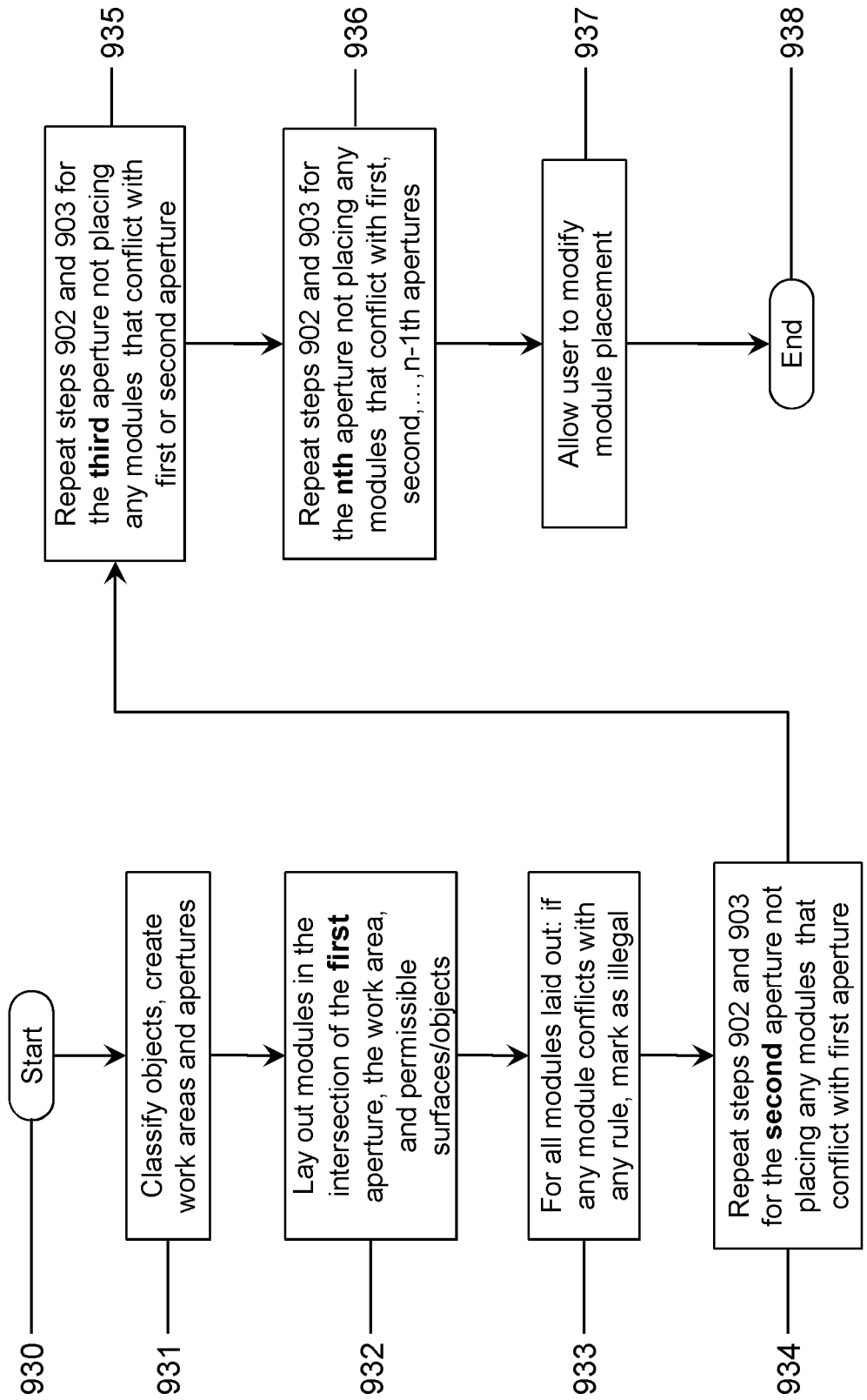

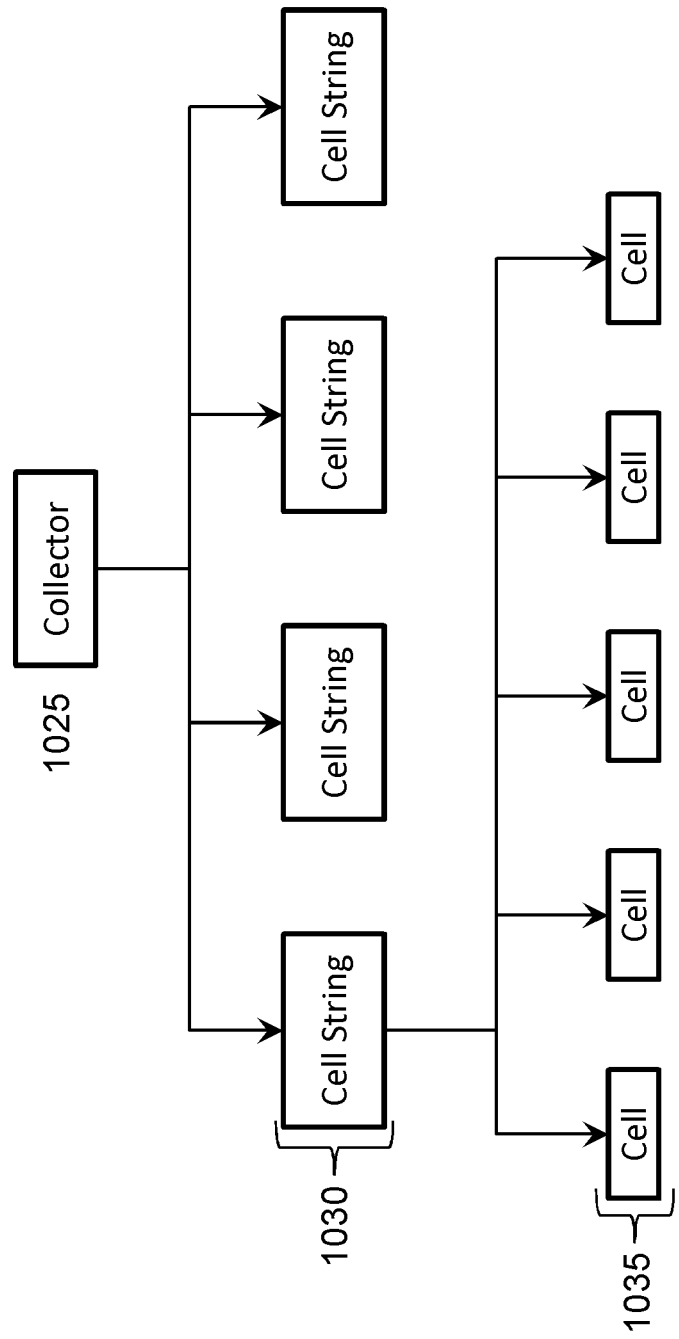

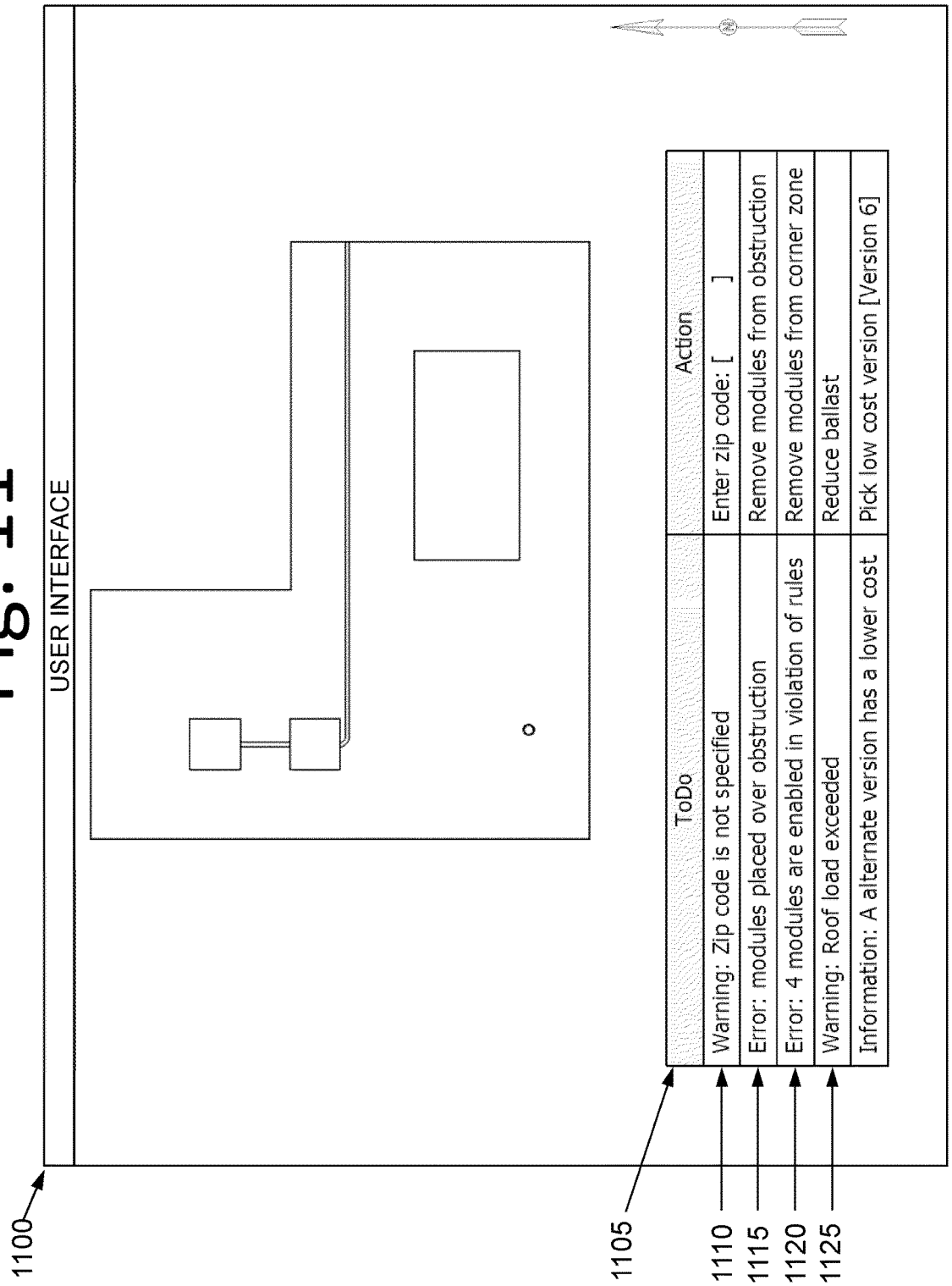

AUTOMATED SOLAR COLLECTOR INSTALLATION DESIGN INCLUDING VERSION MANAGEMENT

RELATED APPLICATIONS

This application is a continuation of U.S. application Ser. No. 15/448,107 filed Mar. 2, 2017, which is a divisional of U.S. application Ser. No. 12/708,486 filed Feb. 18, 2010, which claims the benefit of priority under 35 U.S.C. § 119(e) of U.S. Provisional Application No. 61/154,344, filed on Feb. 20, 2009, the entire contents of which are incorporated herein by reference.

STATEMENT OF GOVERNMENT SUPPORT

The invention described herein was made with government support under contract number DE-FC36-07G017043 awarded by the United States Department of Energy. The United States Government may have certain rights in the invention.

BACKGROUND OF THE INVENTION

In recent years, solar power has become an increasingly important source of energy. Solar energy may be collected and harnessed in numerous ways, including through the use of solar collectors such as photovoltaic (PV) modules and solar-thermal heat and power collectors and converters. The size of these projects may vary tremendously—from single-family residential rooftops to sites exceeding one million PV modules.

The cost, useful lifetime, energy generation and economic value of solar power plants is highly dependent on many complex and interrelated parameters including but not limited to: i) location, ii) weather, hi) physical obstructions that interfere with layout such as a skylight, iv) non-physical site features such as property line set-backs or utility right-of-ways, v) physical obstructions that may cast shade on the system, vi) local building codes that set weight limits and fire safety protection, vii) environmental conditions such as design wind speed tolerance, viii) available mounting suffice, such as the ground, a roof-top or a framework above a parking lot, ix) local, state and federal law, x) utility electrical interconnection requirements, xi) existing electrical equipment at a customer's worksite and xii) the customer's cost of electricity or energy. The task of designing and analyzing an efficient system that comports with these requirements can be complex, time consuming, and error prone, and may constitute a major cost of solar energy project development.

SUMMARY OF THE INVENTION

A computer-based user interface for designing a solar collector installation is disclosed and may include a representation of an installation worksite that contains feature properties corresponding to physical features of the worksite and a solar collector installation layout including solar collectors arranged on at least one surface feature of the worksite, that may be stored in computer storage. The interface may further include a representation of a plurality of differing versions of project state information. Each version of project state information may contain a unique set of user-defined design preferences, feature properties, and/or project properties, etc. Each of the versions may correspond to an alternative solar collector installation layout, and the alternative solar collector installation layout for each version may result from the differences between the unique sets of user-defined design preferences, feature properties, and/or project properties, etc. Each of the differing versions may share at least some of the project state information. The interface may provide a control operable to allow a user to select at least a part of one of the differing versions of project state information for display as at least a part of the solar collector installation layout.

A solar collector installation project data structure is disclosed for use in generating a solar collector design for a worksite. The data structure may include at least two alternative versions of the solar collector design. Each version may include an alternative set of independent project state information and/or a single set of shared project state information. The shared project state information may include at least some information about one or more of the worksite and physical features contained within the worksite. The shared project state information and a first one of the alternative sets of independent project state information may in combination specify at least a part of a first solar collector installation design. The shared project state information and a second one of the alternative sets of independent project state information may be used in combination to specify a second solar collector installation design. The second solar collector installation design may be distinct from the first solar collector installation designer.

BRIEF DESCRIPTION OF THE DRAWINGS

FIG. 5B illustrates the user interface of FIG. 5A, in which a PV module layout has been generated by a layout engine in accordance with the inputs (e.g., feature properties, project properties and design preferences) and layout rules (e.g., layout constraints, environmental factors, local building codes, etc.);

FIGS. 9A and 9B are flow charts illustrating processes by which PV module layouts may be created by a layout engine in accordance with multiple user-defined apertures, each of which may contain differing aperture design preferences;

FIGS. 10A and 10B schematically illustrate a partial hierarchy of data representing worksite features and solar collectors to be arranged in a software application in accordance with the teachings herein;

FIG. 11 schematically illustrates a user interface containing a list of exceptions, including warnings, errors, and contract exclusions, and various mechanisms by which a designer may address such exceptions;

DETAILED DESCRIPTION OF PREFERRED EMBODIMENTS

Figure 1:
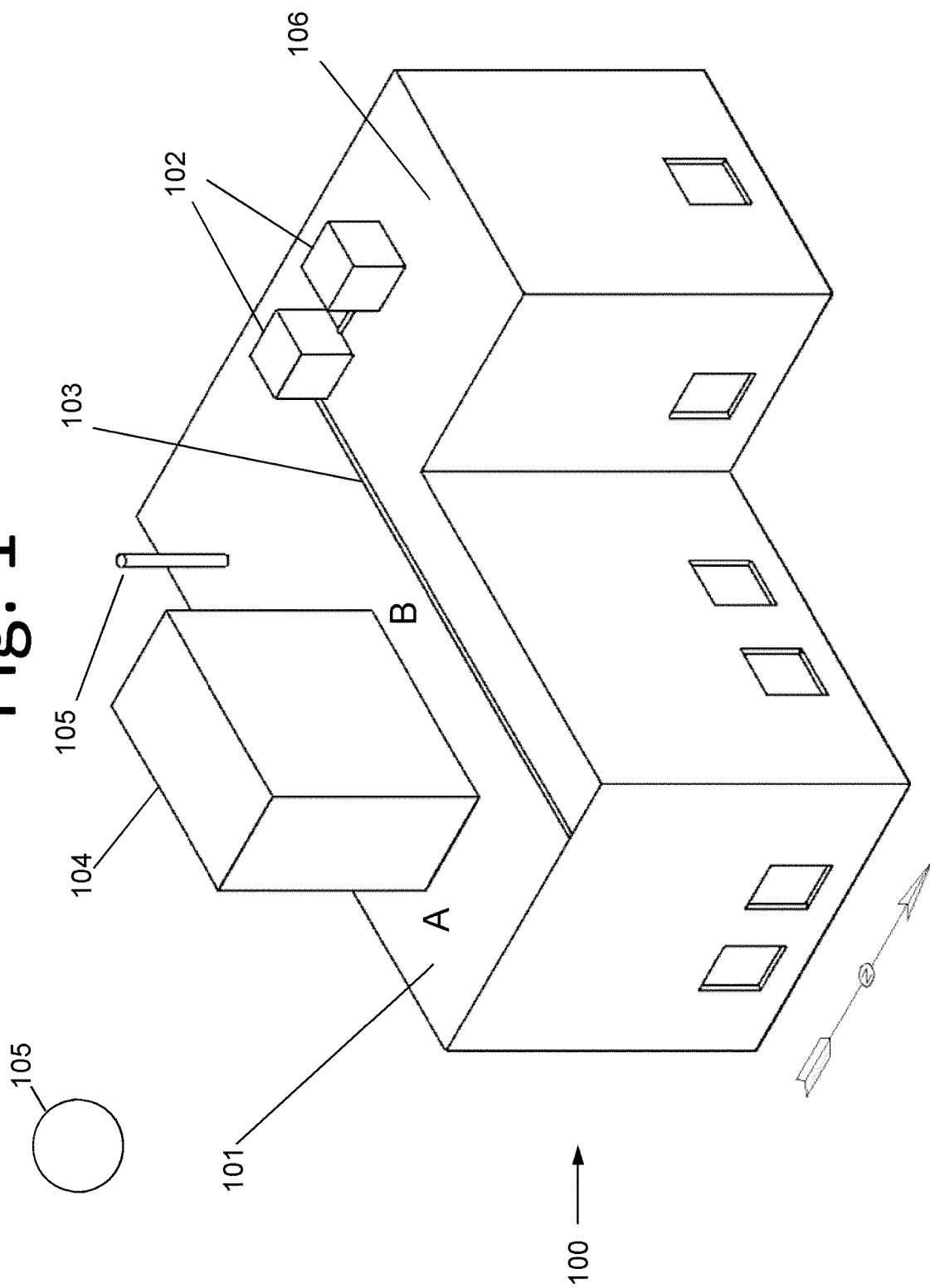
FIG. 1 is a schematic isometric view of an example worksite for a solar collector installation containing roof, exhaust fan, and conduit features.

Computer aided design systems (CAD) have been in commercial use for many decades. CAD systems provide efficient methods to automate the creation, editing, presentation, and retrieval of design information. The power of CAD systems has been enhanced through the use of "knowledge-based" programming techniques whereby engineering and/or design rules can be formalized, encoded and executed to automate portions of the design process or to detect potential design errors. A common example of a knowledge-based system is the grammar checking function found in most commercial word processors whereby many rules of English grammar have been encoded and are automatically applied to text documents to highlight potential errors and suggest corrective action.

The systems and methods described herein involve the application of knowledge-based CAD techniques for the automatic layout, evaluation, and optimization of solar energy system designs consistent with a large number of design constraints, such as the local site conditions, engineering rules, and building codes. A preferred embodiment is implemented as an integrated set of software customizations to an existing CAD system, such as AutoCAD®. Alternatively, the systems and methods described herein may be implemented as completely new standalone software program(s).

A preferred embodiment of the invention described herein provides a system and method for designing solar collector layouts suitable for installation at a given worksite. The embodiment may include systems and methods to create and edit various data "objects" and to classify such objects as various types of pre-defined "features" with attendant properties and layout constraints. The classes or categories of features may include (i) physical worksite features such as walls, roofs and exhaust fans; (ii) intangible, non-physical worksite features such property boundaries, zoning boundaries, utility right-of-ways, flood plains, environmentally-sensitive areas, special seismic zones, and utility easements; and (iii) solar energy system components and arrangements. As part of or in addition to classification, the embodiment may include systems and methods to create, assign, and edit intrinsic and extrinsic properties to these objects. Intrinsic feature properties include those that are inherent to the object itself, such as height, weight and cost. Extrinsic properties include definitions of how objects interact with other objects. An example of an extrinsic property includes a "setback" provision that establishes the minimum distance (setback) between an object and any adjacent objects.

For example, in a particular legal jurisdiction, it may be impermissible for a structure to be placed within 30 feet of a property boundary. Using a system according to an embodiment, a user may first create a "Property Boundary" feature type as follows: The user may (i) create a new type of feature class named "Property Boundary," (ii) set the visual representation of the Property Boundary feature class to be a dashed black line; (iii) define a property called "Set Back" and assign it to the "Property Boundary" feature class, (iv) assign a default value, such as 30 feet, to this feature type; and (v) store this feature class definition within a feature class database for use in a particular design or for general use in any project design.

Subsequently, a designer may use the pre-defined feature type "Property Boundary" as follows: The designer may (i) create or import a representation of an installation worksite into an embodiment, (ii) assign the pre-defined type "Property Boundary" to one or more geometric elements in the worksite representation (such as a line), (iii) subsequently change the value of the object's "Set Back" property as necessary, e.g., to 20 feet, and (iv) command the embodiment to generate a solar system design, including a layout of solar collectors, that complies with the setback provisions of the objects marked as "Property Boundaries."

As part of the process of generating a solar collector layout, a preferred embodiment of the invention may provide methods and systems for the (i) creation of design rules, (ii) application of these design rules to the objects described above to generate one or more solar energy system design alternatives, (iii) generation of on-screen and/or paper representations of the physical layout or arrangement of the one or more design alternatives, (iv) generation of summaries of one or more versions of one or more designs, such as part count, capacity, cost and energy production, (v) tracking of exceptions to software-encoded design rules for user compliance or the manual modification or override of such design rules as a mechanism to provide both flexibility to the user and assurance that customer, engineering, legal, and manufacturer requirements are addressed, and (vi) generation of visual information for the designer to enable them to assess, in real-time, the relative benefit of design alternatives and design modifications to assist in design optimization.

A method of operation according to a preferred embodiment includes: (i) importing information describing the worksite into the knowledge-based solar CAD system or the creation of this geometric description using the CAD system; (ii) associating, as by classifying or categorizing, each of the relevant graphical elements that describe the worksite as one or more instances of pre-defined data object types and adjusting their respective properties; (iii) designating "work areas," e.g., areas of the worksite where project layout may be intended; (iv) choosing design preferences, such as solar collector type and installation size; (v) automatic design generation according to the feature classifications defined in the data representation of the worksite and their attendant properties; (vi) evaluation of the design according to one or more metrics; (vii) generation and comparison of design alternatives; (viii) optimization of a design through design modification and selection of alternatives; and (ix) generation of a list of design exceptions, such as contractual exclusions.

Association may be performed by classifying particular geometric object(s) in a representation of a worksite as an instance of a type of feature, such as "roof" or "exhaust fan." Such classifications may operate to associate the geometric objects with specific properties and layout constraints used to perform the automatic solar energy system design. Additional design rules and properties relating to worksite properties and layout constraints, design preferences, module properties and constraints, performance targets, and so forth, may also be defined. All of this encoded information may be used by the tool to automatically generate a design for the solar module installation that is consistent with designer preferences, project constraints, engineering practice, building codes, etc., and to produce associated information, such as wiring schema, bills of material, presentations, contracts, summaries, auditing reports, other deliverables or outputs according to Table I, etc.

As mentioned above, a tool may also provide control over layout generation by providing a designer with the ability to define one or more particular boundaries for layout generation. Users may define one or more work areas that may correspond to boundaries within which solar collectors may be placed (consistent with other properties and rules, e.g., the properties of classified objects). In this way, a user may use a work area, e.g., to limit solar collector module layout to a portion of the worksite, such as the south facing portion of a roof. Users may also define one or more layout apertures, each of which may correspond to boundaries in which layouts should comply with a distinct set of user-defined design preferences. The use of apertures with distinct design preferences may allow a user, e.g., to place one type of module in one region of a roof and another type of module in another region of a roof.

In some embodiments, as a designer goes through the process of classifying features, generating layouts, and then modifying those layouts, as discussed above, metadata about the design process may be generated. This metadata may take many forms, and may include information about actions the designer has taken, actions the designer should take, and design information that may be useful to supervisors, co-designers, and downstream users and recipients of the design.

In some embodiments, a user interface may be provided such that some or all of this metadata may be presented to the designer in the form of exceptions to encoded rules in the software. Such rules may originate from customer requirements, governmental laws and regulations, engineering constraints, solar collector manufacturer guidelines, etc. Exceptions can include the failure to provide properties, such as a project work area location. The designer may interact with these exceptions in a variety of ways, such as by complying with rules to remove an item from the exceptions list or overriding the application of the rules. Some or all of the metadata may be associated with the design, such as by common storage or reference. Thereafter, downstream users and processors of the design, including automated systems, may access the information. The information may also be summarized, exported, translated, or otherwise operated upon by the system. The list of exceptions may serve as a "To Do" list (and may be named as such in a user interface) for the user, affording the user flexibility in the manner and sequence in which the software rules are addressed while at the same time providing assurances that they do get addressed. The exceptions and how they were handled can also be maintained in a history for later review, and can aid in ensuring that contract documents reflect unusual or non-standard choices.

Some embodiments may provide a system and user interface for viewing, creating, and manipulating multiple versions of a solar collector layout design for a particular installation worksite. The use of versions may allow, for example, a designer to quickly and easily change inputs (e.g., design preferences and/or feature or project properties) and view the resultant outputs (e.g., alternative layouts, cost and performance data) that correspond to the alternative design choices (e.g., the cost impact of using various types of PV modules) for the same project. These versions may provide the designer with the ability to rapidly model different layouts based on changes in user inputs and evaluate the results. Some embodiments may allow the designer to quickly move from one version to another, while others may allow a designer to affect multiple versions with one action. Versions may share one or more sets of elements, properties, or design rules, such that changes made to one version apply to related versions. For example, generic changes to a worksite, such as the addition of a newly discovered site feature, may affect multiple design versions. The versions may share information, by, for example, being located in a single, e.g., composite, file.

1. Introduction

Concepts described herein are applicable to solar energy collector installations generally. Various types of solar energy collectors, such as panels, absorbers and reflectors, and other energy conversion technologies, such as photovoltaic (PV) modules, solar-thermal absorbers, and concentrating solar power (CSP) solar systems, may be used. Solar collectors may be self-mounted or placed on mounting systems of various types, including tilted, fixed, and tracking systems. Systems may be designed for on-grid connection to public utilities and/or for off-grid systems. Solar collectors and mounting systems may be attached to or located on variously the ground, rooftops, walls, parking structures, and so forth. For ease of exposition, embodiments are herein largely discussed in connection with PV module installations. It will be understood, however, the embodiments are applicable to solar collectors generally and as described above.

The task of designing a PV installation typically includes several non-trivial and co-dependent processes. These processes include, for example, (1) selection of particular PV modules based on, e.g., availability, cost, efficiency, power requirements, etc.; (2) generation of a placement (layout) of PV modules at an installation worksite; (3) generation of a wiring (routing) scheme for the placed PV modules; (4) estimation of project outputs, including power production, power conversion efficiency, etc., based upon complex and project-specific inputs; (5) generation of downstream documents, such as project bills of material (BOMs), contracts, etc. Of course, all of the foregoing must be done in compliance with local regulations, national regulations, etc. A sequence of typical steps performed in a large-scale solar project is provided in Table II.

As the size of an installation increases, as measured, e.g., by module count, the difficulty of performing the above processes increases. Even ostensibly trivial changes, such as adding a module in a given a row, can have far-reaching impacts on wiring topology and/or the placement of other modules, and, therefore on the resultant system design and outputs of the system (such as power output). Moreover, because of such complexity, the optimization or modification of layouts, including re-arranging, adding, or removing modules, can be difficult and, especially for large projects, can begin to resemble a process of trial-and-error. By the time a project is designed, which can often take ten to twenty weeks, or a contract finalized, which may take many more months, the originally-contemplated components used in the layout might not be available and significant redesign may be required.

Some of the tedium and complexity of creating a design for a worksite can be reduced through the use of automated tools. In particular, software or otherwise computer-implemented tools are described herein that may automatically generate a design for a worksite based upon encoded information corresponding to engineering practice, designer preference, and worksite conditions. Some such tools will use as a starting point a CAD representation of an installation worksite, e.g., an AutoCAD .DWG file. This file may include a vector or bitmap representation of a worksite, which may typically be represented as a collection of geometric objects, such as lines, polylines, curves, squares, rectangles, splines, symbols, polygons, other 2D or 3D shapes, surfaces, solids, image data, etc. This representation may typically not have much or any semantic information attached to the geometric objects; in particular, the information in this representation may be limited to shapes and dimensions corresponding to features of the physical worksite. So, for example, a 2D plan view representation of a roof with an exhaust fan might consist of a set of four lines forming a large rectangle (the roof) and another set of four lines forming a smaller square (the exhaust fan) where the smaller square is contained within the large rectangle. Conventional tools for CAD, as well as some embodiments, may provide the ability for the user to create this initial representation of geometric objects. Alternatively, the user may import it from a storage location, such as a computer file.

Some embodiments may provide a mechanism by which objects in the representation may be classified (e.g., categorized or tagged) so as to associate the object with semantic information relevant to generating a module layout, such as feature type. For example, a set of lines may be classified by a user as an instance of the pre-existing feature class of "roof." The system may use this classification to associate the objects with a set of semantic information corresponding to the relationship between a roof and a module layout. This information may be related to the intrinsic physical properties of a roof, such as "pitch=17 degrees" and "height=30.0 feet," and/or extrinsic properties of a roof (such as "edge setback=1.0 foot"). Such properties typically may be editable by the user and may vary across different instances of the same general type and by legal jurisdiction (zoning laws, etc.). An example list of feature classes is provided in Table III; an example list of feature properties is shown in Table IV.

Similarly, another object (or set of objects) in the worksite representation may be classified by the user as an instance of the feature type "exhaust fan." The system may thereafter associate the object with feature properties corresponding to a exhaust fan, such as "height=3 feet." In some embodiments, a virtually unlimited number of objects may be classified as different types of features with different properties. For some of these various features, feature properties may be categorically pre-determined (and thus applicable and invariant to each instance of a particular class or type) while other feature properties may merely have default, instance-specific values. Many feature properties, such as height, may be adjusted by a user as necessary and/or expedient, while other types of feature properties, such as those that are relevant to the entire feature class, may or may not be editable by a user. As such, each classified object may have feature properties shared with and/or distinct from those of other classified objects.

The semantic information associated with a particular object may also correspond to generalized design rules that may typically be invariant for all instances of the particular feature class. For example, objects classified as roofs may generally be associated by the system with appropriate feature layout constraints, such as "collector layout allowable=yes," and other design rules relating to how modules may be placed on or around a roof. As discussed below, in some embodiments, design rules may be overridden at least during initial use of the software, but a list of exceptions maintained to track any variances from the rules' requirements.

In this way, through the classification actions of the user, the original, simple geometric representations of objects may be assigned additional, e.g., higher-level, feature information to be used by the automatic design system. In addition, the system may provide a mechanism by which objects are automatically classified as instances of features and by which values are assigned to feature properties and design properties. A shape-recognition algorithm, learning algorithm, or other expert system may be used to classify objects and assign values. In addition, geometric objects may be modified, e.g., repaired, as by a pre-processing stage, to place the objects in a better condition or position for classification, feature assignment, or layout processing. A repair engine may also use input from a designer, e.g., an attempted classification, as a basis for repairing objects. For example, if a designer attempts to classify four lines as a "roof," but the lines do not form a fully-closed shape, a software repair engine may attempt to repair the objects, as by making the appropriate lines co-terminal.

Some embodiments may provide a layout component, such as a layout engine software module, that uses the classified objects, their classifications and encoded information, e.g., the set of feature properties, and possibly other information as described below, to create a module installation design. So, for example, because an object classified as a "roof" may be associated with the layout rule of "layout allowable=yes," a layout engine may know that it may consider placing solar collectors in the bounded area between the classified objects marked as forming a "roof" Similarly, the layout engine may know not to allow placement modules in the area corresponding to objects marked as "exhaust fan," because exhaust fans, as a class or as a particular instance, may be associated with the layout rule of "layout allowable=no." As such, objects that potentially allow placement of modules within them, such as roofs, may be referred to as creating implicit "work areas" in which modules may be placed (consistent with other layout rules), such that separate user definitions of a work area may not be needed.

A user may also be provided with mechanisms to assert even greater control over the layout process. For example, a user may be allowed to refine the boundaries of acceptable module placement by, e.g., explicitly defining one or more user-created work areas. A user-created work area may be a geometric object created by the user and associated with a particular set of layout rules, including, for example, "layout allowable=yes." A layout engine software module thus may be configured to consider placing solar collectors only in locations that are contained within an explicit, e.g., user-created, work area, an implicit work area, either, or both. This may be useful, for example, if a designer wished to limit solar collector layout to only a portion of a roof, which could be accomplished by creating a work area over only the desired portion of the roof.

A user may also be allowed to specify different design preferences, such as module type or orientation for the solar collector layout, and, moreover, different choices can be made to apply to different areas of the representation. Table V provides an illustrative list of sample design preferences. So, for example, a user may be allowed to define a boundary wherein a particular set of design preferences is applied e.g., by defining one or more apertures. An aperture may be a boundary or frame represented by a geometric object created by the user. The system may associate the aperture with a set of design preferences, including, for example "PV module=SD305" and/or "tilt=45 degrees." A layout engine may be configured to place solar collectors, e.g., PV modules, within the boundaries of a given aperture consistently with the aperture's assigned design preferences and the relevant feature properties, layout rules, and other applicable properties and design rules. In some cases, a user may define more than one aperture, and, thus, the layout engine may use varying sets of design preferences for layouts in different areas of the worksite. Distinct apertures may be useful, for example, if a designer wished to place one type of module, e.g., SD305s oriented north-south, in one area of a roof and another module, e.g., SP225s oriented east-west, in another area of the roof. As another example, multiple apertures may provide heterogeneous layouts for the purpose of defining different spacings between rows of modules in different regions of a work area. According to some embodiments, a layout of solar collectors may be generated in any allowable solar collector installation region within (e.g., only within) a work area and within a layout aperture according to the aperture's design preferences regarding placement of solar collectors and the properties of any objects and features, and the layout rules or constraints associated therewith. The layout may take into account collector modules and other objects and features that are outside a work area or aperture if, for example, the design preferences and properties of the objects are such that setbacks call for it. For example, an object such as an exhaust vent may be wholly or partially outside an aperture, but if the application of design preferences restricts the layout of modules within a meter of the vent, and the exhaust vent is sufficiently proximate to the aperture or work area, then that exhaust vent may be taken into account.

In some cases, apertures as defined by the user might overlap or otherwise interrelate with each other. In such a case, aperture conflict resolution rules may be utilized. For example, a conflict resolution rule may define Aperture 1 as taking priority over Aperture 2. A layout engine may thus give modules placed in accordance with Aperture 1 priority over those placed in accordance with Aperture 2. This may be useful, for example, if the designer defines apertures with overlapping boundaries, or if a designer wished to place solar collectors, e.g., PV modules, on both sections of a concave roof (i.e., the facing walls of an inverted or "V"-shaped roof). Because collectors and their mounting structures may have significant height, there may be a conflict in module placement at the intersection of the two roof section (i.e., the bottom of the V). If one roof section receives more sunlight than the other, the designer may wish to define an aperture for the sunny section, and an aperture for the shady section. The user may be allowed to assign priorities to the two apertures, such that, in the event of conflict, the layout engine will place modules according to the design preferences of the sunny aperture over the design preferences of the shady aperture. This may result in a net increase in the average per-module power generation for the installation. A default priority may be assigned to apertures, for example, in accordance with the sequence in which the user defines the apertures or an explicit priority.

The results of a design, including layout, may be displayed, saved, printed, transmitted, or otherwise utilized. Additional information pertaining to the layout, such as bill of materials, a rendering, a financial analysis, a contract, a contract term, an energy projection, a cost analysis, a parts list, a simulation, a project schedule, an avoided cost analysis, a presentation, a term sheet, and so forth, may be generated based on the encoded information and generated layout.

Software controls to perform the foregoing actions may be included as part of CAD software. Alternatively or additionally, a specialized engine, library, or plugin may be loaded into the CAD software at startup or on demand. Alternatively, a specialized or new software program may be written dedicated to the implementation of embodiments of the invention. Many mechanisms for creating, selecting, and operating upon objects in a CAD software environment are well-known in the art; such mechanisms include, for example, click-select, drag-select, shift-select, clicking and right-clicking on icons, toolbars, popups, objects, and so forth. Joe Sutphin's "AutoCAD 2006 VBA: A Programmer's Reference," 101 *Productions* (2005), ISBN 9781590595794, which discloses many such methods, is hereby incorporated by reference in its entirety.

2. System Operation and User Interface

FIG. 1 provides a schematic illustration of an installation worksite for which a solar collector layout will be designed.

For convenience, the embodiments discussed herein use photovoltaic (PV) modules as examples of solar collectors. PV modules are to be placed on the roof 101 of a building 100. The roof 101 may have a set of physical features, such as exhaust fans 102, conduits 103, walkways, pipes 105, large HVAC appliances 104, skylights, elevator machinery, stairwells, and so forth. When projected geometrically onto the roof 101 (as in a top-down birds-eye view), features may appear solid/two-dimensional (such as exhaust fans 102) or linear/one-dimensional (such as conduit 103) relative to the roof. A given feature may have a regular footprint on a roof, such as the rectangular footprint arising from an exhaust fan; alternatively, features may have an irregular footprint. Features of a roof may also be intangible, such as areas 106 of high wind or updraft. The roof 101 and each feature upon it or relating to it may have a set of characteristics relevant to solar collector installation design. For example, PV modules are not typically placed on an exhaust fan or within a prescribed setback from an exhaust fan 102, where the setback may be determined by regulation, customer policy or design choice. Similarly, PV modules typically are not placed in areas of high wind 106, or within a certain distance of an edge or corner of the roof 101.

The features of a roof may also determine the relative performance of PV modules placed on the roof 101. For example, presuming that the roof 101 is most typically exposed to sunlight from the South (indicated as 105), a PV module placed at a location A is likely to generate more power, on average, than a PV module placed at location B (which is at least partially obscured by a large HVAC appliance 104).

Figure 2:
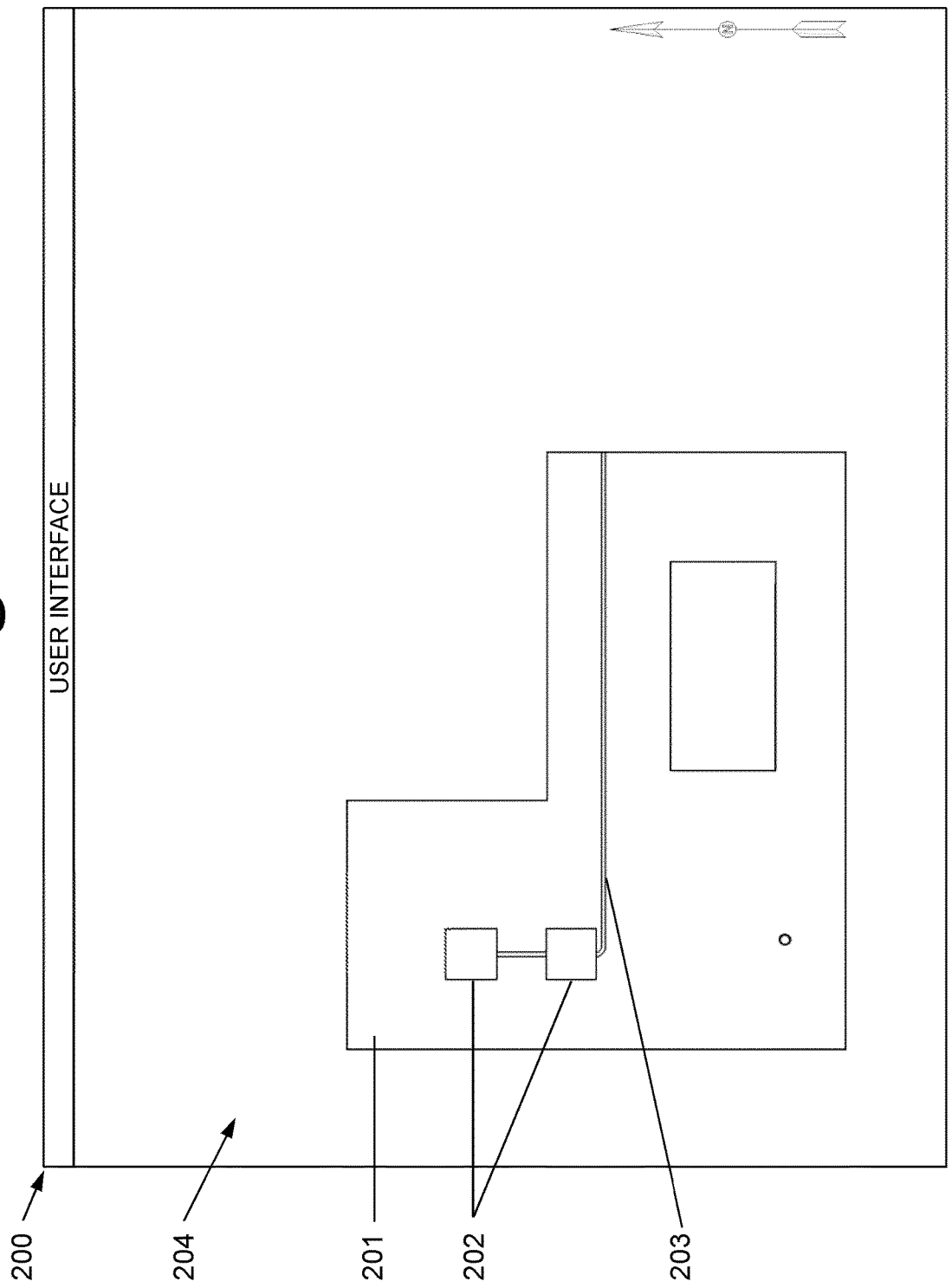
FIG. 2 schematically illustrates a user interface containing a visual representation of the installation worksite of FIG. 1, including geometric objects corresponding to the roof, exhaust fan, and conduit features.

FIG. 2 illustrates the installation worksite of FIG. 1 as represented in an example user interface of a computer-aided design (CAD) system 200. The CAD system 200 may include a 2D or 3D visual representation of the installation worksite. Typically, the representation includes three-dimensional information about the features of the worksite. For convenience, the embodiments are described with reference to a 2D plan view 204. The visual representation may be constructed of geometric entities, such as lines, line segments, polylines, arcs, curves, circles, square, rectangles, polygons, etc. These geometric entities may be closed, meaning they define a bounded area, open, or self-intersecting, may be planar or non-planar, and may include holes, complex surfaces, and geographic topography. These geometric objects may correspond to physical or non-physical features at the physical worksite. For example, the representation 204 provides two polygons each defining bounded areas referenced by numeral 202 corresponding to the exhaust fan features 102 from FIG. 1. A set of line segments and curves 203 corresponds to the conduit feature 103 from FIG. 1. The visual representation may first be loaded into the CAD software through the use of a particular file format, such as AutoCAD .DWG. Alternatively, the visual representation may be created in the CAD software through the use of standard CAD drawing tools. The visual representation 204 in the CAD software may represent only a portion of a worksite or representing areas beyond the worksite.

At this point, the representation of the worksite in the CAD software may have very little semantic information attached to it. For example, other than mere geometry, the four line segments that form each of the bounded areas 202 may not be associated semantically with, or otherwise have meaning in relation to, the corresponding exhaust fan features 102. Characteristics of an exhaust fan feature relevant to PV module design, such as typical setback or the shadows it may cast (e.g., is expected to cast) at different times of day or year, might not be incorporated in the representation. Similarly, the lines 201 corresponding to the outline of the roof might not be associated semantically in the CAD software with the roof 101 of the worksite. Rather, from the perspective of the CAD software, the visual representation may simply be a collection of geometric objects with dimension information only, removed from semantic relation to each other, the external worksite, or solar collector installation design. Alternatively, the representation may have some semantic information attached to objects, such as, for example GPS data. This data may be used in subsequent steps in the process.

Figure 3:
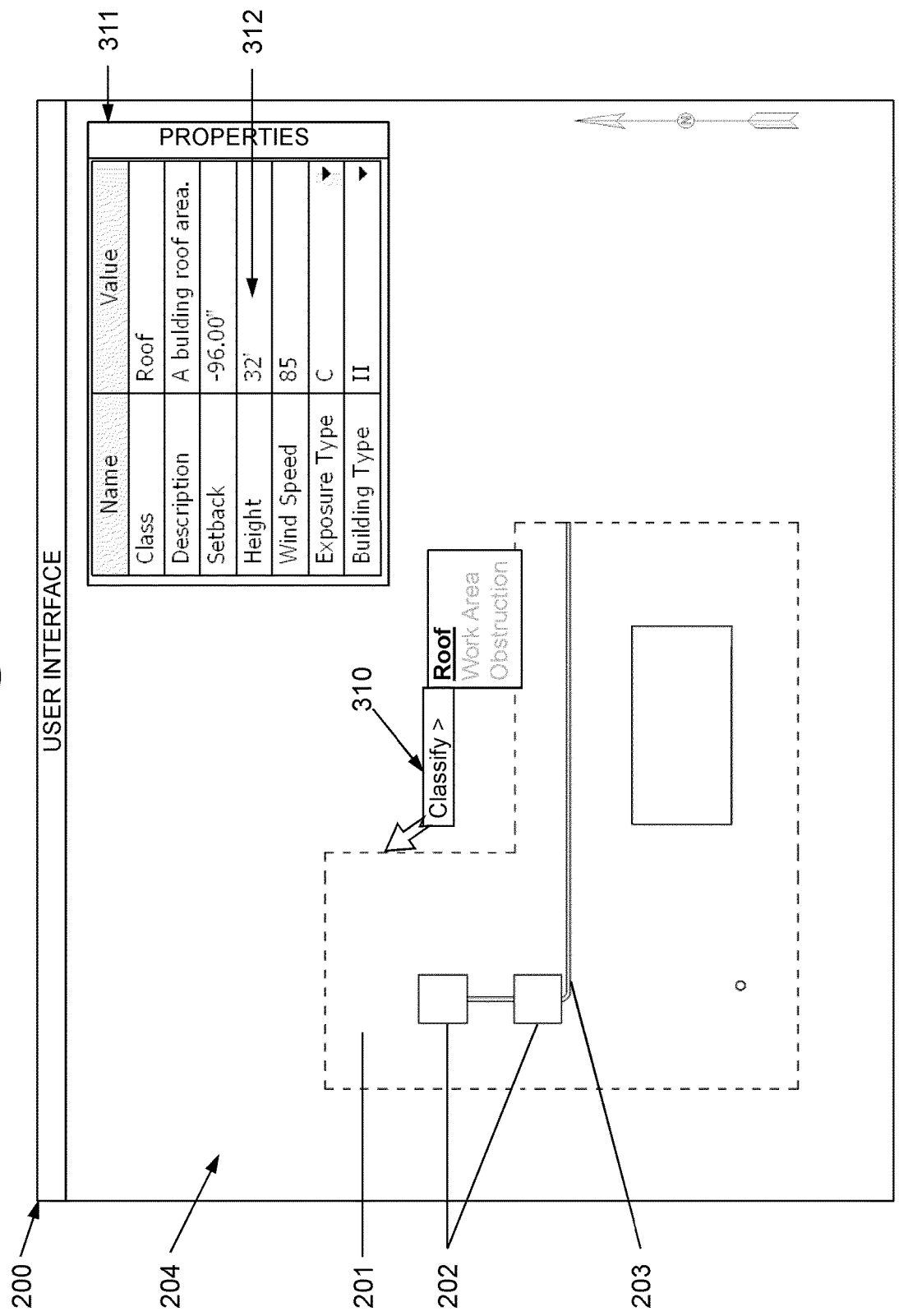
FIG. 3 illustrates the user interface of FIG. 2, in which a first geometric object in the visual representation is being classified as a "roof" and thereby associated with a first set of feature properties and corresponding layout constraints.

FIG. 3 illustrates a process by which the visual representation and the geometric objects within it may be given semantic meaning. A classification component of an embodiment may perform this action by allowing a "dumb" geometric object, e.g., one having dimensional information only, to be classified, automatically or by the user, as an instance of a particular type of feature. As part of classification as an instance of a class of feature, an object may be associated with a set of additional feature properties, which may include properties of the feature that may pertain to solar collector installation design, such as height, setback, etc. The classification and properties may be used by the system to associate the object with layout rules corresponding to potential interactions between the classified object and other objects and impact on a resulting solar collector design. These feature properties may be recognized, utilized, and operated upon by software, such as a layout engine that applies layout rules to objects.

So, for example, polyline 201 may be associated with a type of feature, such as "roof" This classification may implicate layout rules relating to the placement of PV modules on roofs. These rules, when invoked by a layout engine, may operate on feature properties of the particular roof (e.g., a vertical height off the ground and roof pitch). The properties associated with an object may be determined by correspondence or interrelation with other object properties. So, for example the height of an exhaust fan relative to a roof (which may be useful for calculating the shadow cast by the exhaust fan on the roof) may be determined from feature properties describing the absolute maximal altitude of the exhaust fan and the absolute height of the roof at the point of the exhaust fan (which itself may be determinable by the roofs properties of height and pitch). In this way, the encoded information, including object classifications and feature properties, may form (or be associated with) a complete or partial specification of the characteristics of the physical features of the installation worksite as they relate to PV module layout design. In particular, the characteristics of the physical feature related to solar collector layout design may include or form at least a partial set of information for the automatic placement of solar collectors within or around that physical feature. Pre-defined feature classifications and classes may include physical features and non-physical features, such as a property boundary, a real-estate parcel boundary, a zoning designation, a utility right-of-way, a flood plain, an environmentally-sensitive area, or a special seismic zone.

In particular, some geometric objects may be classified as instances of features types that provide allowance for placement of PV modules, e.g., a geometric object classified as a roof may be associated with a layout rule that generally allows placement of PV modules on its surface. As such, the classification of an object as a "roof" may cause that object to be treated as an implicit work area. Similarly, some geometric objects may be classified as features that prohibit, or otherwise do not generally allow, placement of PV modules, e.g., a geometric object classified as a pond or an air conditioning unit may be associated with a layout rule that generally does not allow placement of PV modules on the obstruction or within a prescribed boundary, e.g., distance, of the obstruction. Other layout rules to be imposed on the placement of PV modules may be defined, including constraints embodying the application of construction regulations and codes, wind conditions, temperature conditions, power and heat generation limitations to module placement on or nearby a given feature.

The form and content of the feature properties associated with a given type of feature may precede or pre-exist the creation of a corresponding object. Classes of physical features, and the encoded information corresponding thereto, may be predefined. So, for example, the set of properties and default values corresponding to a roof or other surface, and the design rules that apply to them, may be stored in a database and/or as part of a class definition. (See Tables III-IV.) When a particular object is classified as a roof, the class definition may be instantiated and associated with the particular object. Of course, the software may provide a mechanism whereby additional types of features may be defined by the designer and used for classification. Similarly, the default or pre-existing encoded information, including default values for properties and layout constraints, for a given type of object may be modified by designers or administrators. Modification of the encoded information may take place before generation of a layout and/or after generation of a layout. Modification of certain encoded information, such as feature properties, after generation of a layout may trigger automatic regeneration of the layout based upon the new set of data. Some implementations may allow the creation or modification of feature classes at the time of categorization. For example, the user interface may present the above-described capabilities integrated into or accessible from the classification interface components.

The mechanisms or user interface controls by which objects are classified, modified, or otherwise associated with properties may vary. For example, as shown in FIG. 3, a user may select the polyline 201 corresponding to the roof 101. The user may then click upon a "Roof" or "Classify As . . . " toolbar button or icon, or select similar commands from a menu. The user may also right-click with a pointer tool on the polyline 201 to simultaneously select the polyline 201 and open a context menu 310 that allows classification as a roof. During selection and classification, the representation of the object may be changed to indicate its selection or classification. For example, its color may be modified, its line weight or style may be changed (as indicated here by the dashed polyline 201). Many types of controls for performing actions upon objects in a user interface are well-known in the art. Multiple objects may be classified as instances of the same type of feature, such as a "roof," which may allow the system to create layouts for worksites containing multiple roofs. Different types, or subtypes, of features may be represented differently, such as being placed on distinct drawing layers in the user interface and/or may be given different colors or line weights. A control to declassify an object may be provided.

Mechanisms for automatically repairing invalid or deficient worksite geometry may be employed. For example, suppose that, in one embodiment, the design rules require that a "roof" be represented by a closed polygon. Suppose further that the geometric information corresponding to a roof in a worksite representation is composed of four line segments whose common endpoints are in close proximity but are not coincident (i.e., not forming a closed shape). This geometrical representation may cause a processing error or produce incorrect results if the line endpoints are left non-coincident. In one embodiment, a mechanism may be provided to pre-process geometric elements during classification, for instance, to transform line segments with non-coincidental endpoints that are within a specified degree of closeness to each other into line segments with shared end-points. Geometric algorithms for repair of non-semantic geometric data exist.

The software may also provide controls to allow a user to see and/or modify some or all of the encoded information, such as editable properties, associated with a given object. So, for example, the user interface may include a properties roll-up, toolbar, or palette 311 that shows representations of some or all of the feature properties associated with that object. Some feature properties, such as vertical height 312 for a roof, may be adjusted by the user. Other feature properties, such as the resulting area, e.g., in square meters, of the roof that may be used to place PV modules may be calculated by the software, e.g., dictated by the interaction of layout constraints, feature properties, and so forth. Other information, such as an indication of the layout rules applicable to a given object, e.g. a indication that a particular object is suitable for placement of PV modules, might not be displayed or visible to the user. Many types of controls for modifying the properties of objects in a user interface exist.

Some embodiments may include a hierarchy of feature classes. For example, features may be divided into three main categories: placeable surfaces, solid obstructions, and linear obstructions. Each category may include several types of feature. For example, placeable surfaces may include roofs, fields, walls, etc. Solid obstructions may include exhaust fans, poles, HVAC units, depressions, trees, roof hatches, antennas, satellites, stairs, drains, penthouses, roof shot, skylights, sleepers, survey points, vents, valves, etc. Linear-type obstructions include walkways, equipment, expansion joints, walls, conduits, pipes, etc. Each type of feature may also contain subtypes, e.g., an antenna obstruction may be sub-typed as an outline antenna, a point antenna, etc., and a conduit may be sub-typed as an electrical, water, support, vertical, etc. conduit. Some obstructions may be classified as either solid or linear, depending on the specific geometry (e.g., a set of stairs).

Figure 4:
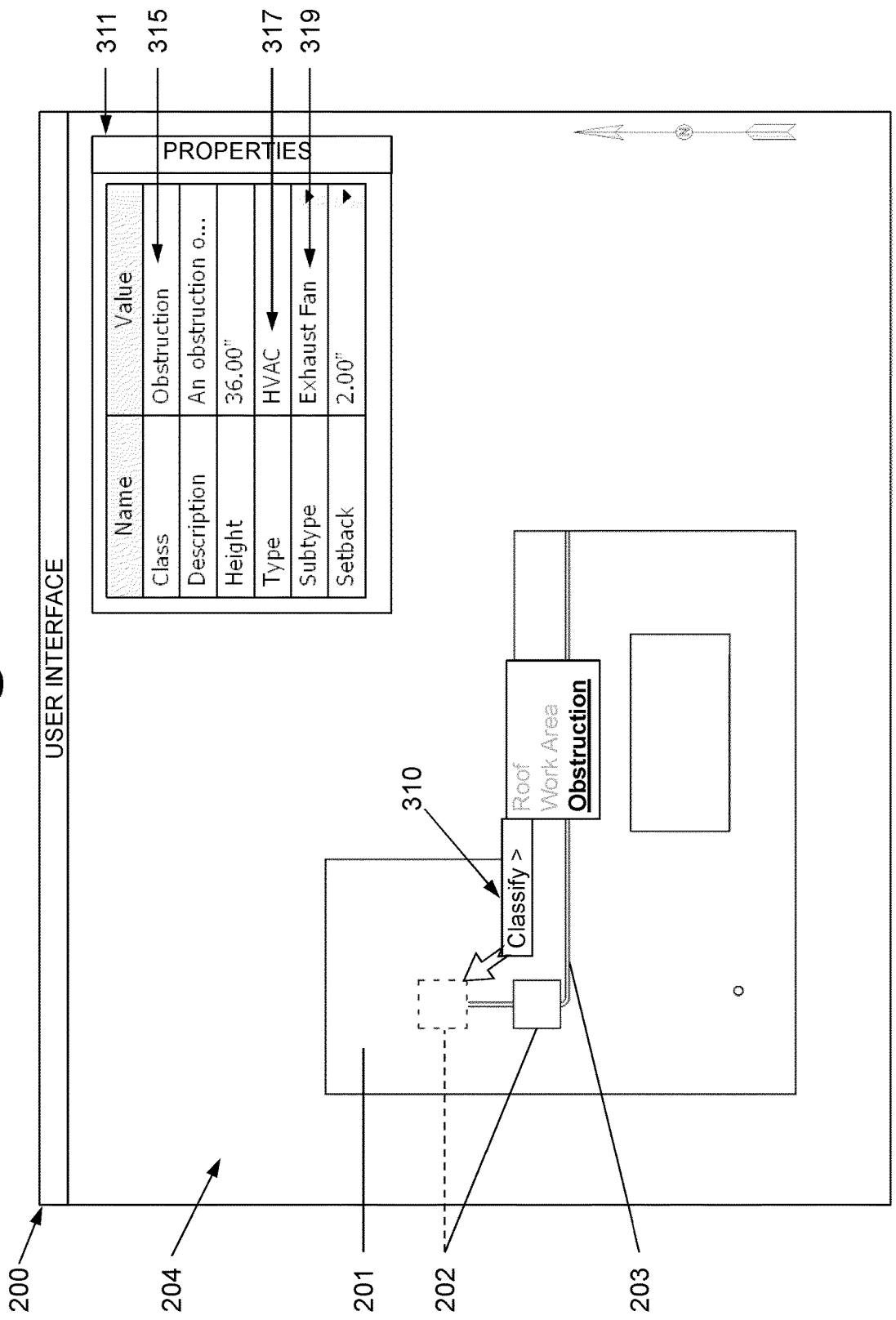
FIG. 4 illustrates the user interface of FIG. 3, in which a second geometric object is being classified as a "obstruction" with sub-type "exhaust fan" and thereby associated with a second set of feature properties and corresponding layout constraints.

Similarly, FIG. 4 illustrates a process by which a second object may be classified to associate it with semantic meaning. Here, the set of lines or polyline 202 corresponding to an exhaust fan on the roof is being classified as a solid obstruction, viz., an "HVAC unit" of subtype "Exhaust Fan," through the use of a context menu 310 and properties palate 311. Here, the dashing of the line is used as a visual cue to the user that this particular object has been selected. Properties palate 311 shows sample relevant feature properties and their current values for the exhaust fan, including height, setback, subtype, etc. The palate 311 shows that the object 202 in FIG. 4 has been classified as a feature of category (or class) solid obstruction 315, type HVAC 317, and subtype Exhaust Fan 319. In this way, multiple objects corresponding to the physical installation worksite may be classified. In some arrangements, rather than requiring a user manually to classify objects as illustrated above, a system initially may attempt to auto-classify objects based upon, e.g., heuristics and analysis of the representation of the worksite or meta-data already available, e.g., objects in a pre-made CAD drawing layer named "skylights" may be auto-classified as skylights. A system may allow or require later modification or verification by a user. A system may use any information related to the geometric objects, such as GPS data, to auto-classify objects.

Not all properties need be associated with a particular feature or geometric object in the representation. For example, the software may allow the use and setting of global project properties, such as worksite location (zip code), orientation of the worksite (north arrow), drawing scale, units of measure, country location, customer information (customer name, address, etc.). Project properties may include customer properties, including contact information, legal status, financial condition, utility information, utility rate, and energy consumption, and may be predefined. Other project properties may include soil type, weather conditions, design temperature, design seismic load, operating characteristics, load limits, and electrical interconnection requirements, and so forth. This information may be input manually by the designer or may be accessed through a link to an external data source such as a Customer Relationship Management ("CRM") system used to hold the customer account information. Table VI provides an exemplary list of project properties. Similarly, some design rules, such as project design rules, e.g., global layout rules, may operate independently of any particular feature, such as electric power interconnection standards that regulate the interconnection of any PV system to a public utility. Predefined project design rules may form a specification of an electrical code regulation, a property setback requirement, a safety requirement, a interconnection requirement, an engineering rule or best practice, a fusing requirement, etc. Such regulatory rules may be adapted to produce a layout that may be connected to a public utility grid, a private electrical grid, or another specification.

The type(s) of module used in a design may also affect how the layout engine operates, because module types may be associated with particular module-specific information, such as module properties, e.g., inter-module spacing, voltage, wiring requirements, weight, etc. Some module-specific information may be associated with particular types of modules, mounting systems, inverter types, and so forth. Different module design rules may operate on a per-module, per-module-string, and/or per-module-sub-array basis. So, for example, a particular module may require a minimum inter-module spacing and operating temperature or a particular wiring configuration, such as the number of modules per string as a function of temperature. Table VII provides an example list of module properties.

Figure 5A:
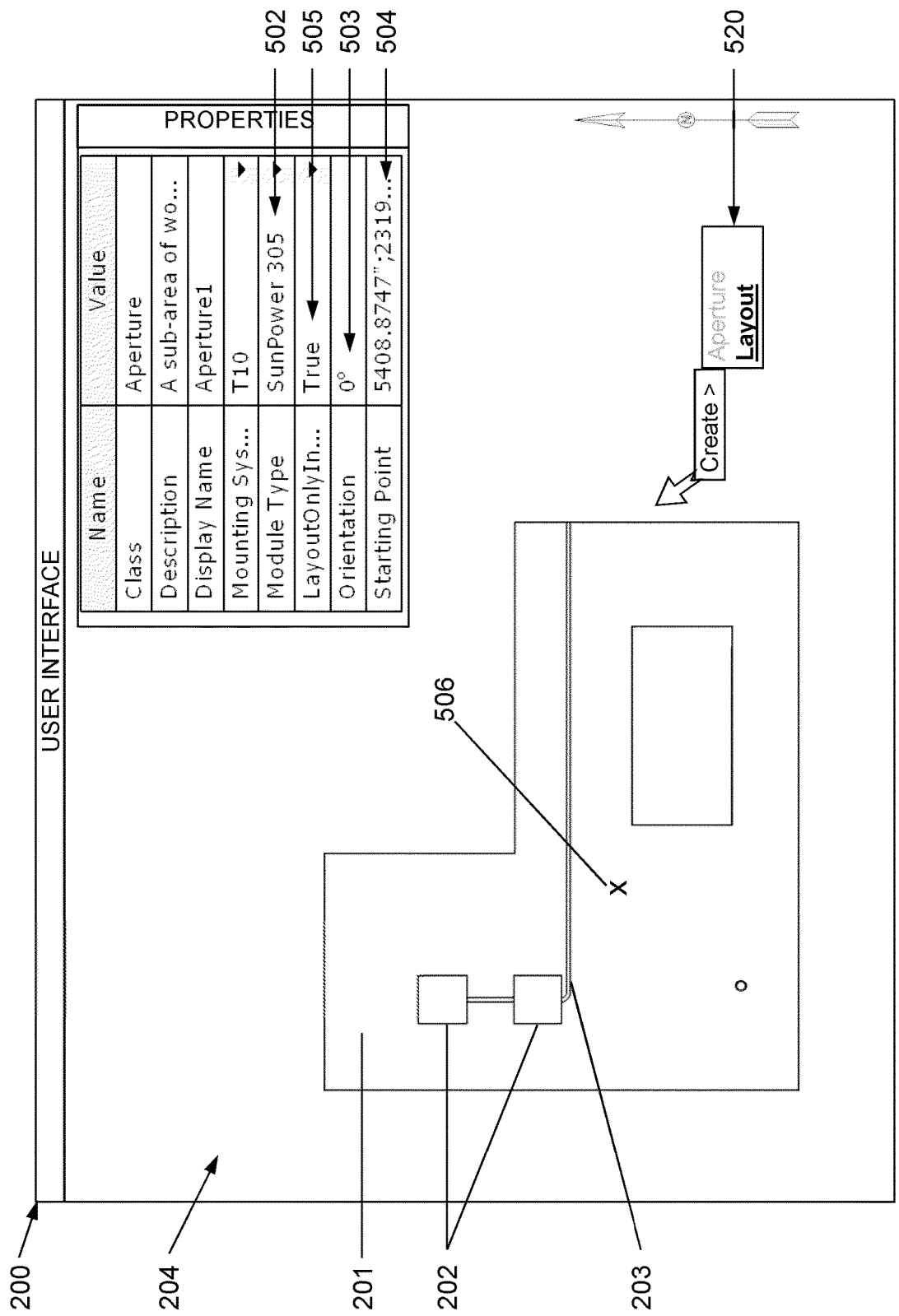
FIG. 5A illustrates the user interface of FIG. 4, in which an example set of design preferences for the generation of a layout, including a PV module type, orientation, and starting point, are being input.

As shown in FIG. 5A, design preferences, including the type(s) of modules 502 and/or mounting systems to be used, the orientation 503 in which to lay out rows and columns of the modules, the start point 504 (or origin) of the tiling layout, inverter type (where there are options), etc., may also be specified. The user may be provided with the ability to modify one or more of the operative global properties, design preferences, and/or module properties. For example, orientation of modules with respect to true north, may be entered numerically into an appropriate control, as shown at 503. Alternatively, orientation may be set by selecting an existing line, such as the edge of a roof top, and indicating module orientation should equal the selected line. A start point for layout may be set by, e.g., entering coordinates into an appropriate control 504 and/or selecting a point in the visual representation with a pointing device like a mouse or touch screen, as shown at 506. A control, such as a context menu 520, may be provided to invoke a solar collector installation layout engine. At the time of specifying design preferences, it may also be possible to define new types of those preferences which consist of enumerated types, such as solar collector modules, mounting systems, or inverter systems. These newly defined types are advantageously added to the store of defined types and are available for use during specification.

As shown in FIG. 5B, the layout engine may be invoked so as to generate a solar collector design based upon, and consistent with, the relevant encoded information, such as feature classifications, feature properties, work areas, design preferences, global properties, module properties, layout and design rules, etc. In the case of PV modules, this layout may include a physical arrangement of PV modules, as displayed in the representation, and an attendant arrangement of wiring systems, mounting systems and hardware, electrical components for the proper operation of the installation, etc. In some cases, PV modules may be placed in such a way as to be consistent with all (or substantially all) the rules and constraints for all the objects. A number of different methods and systems may be used to create such a PV module layout. In particular, a layout engine component of a system may create a layout using a tiling algorithm.

Figure 6A:
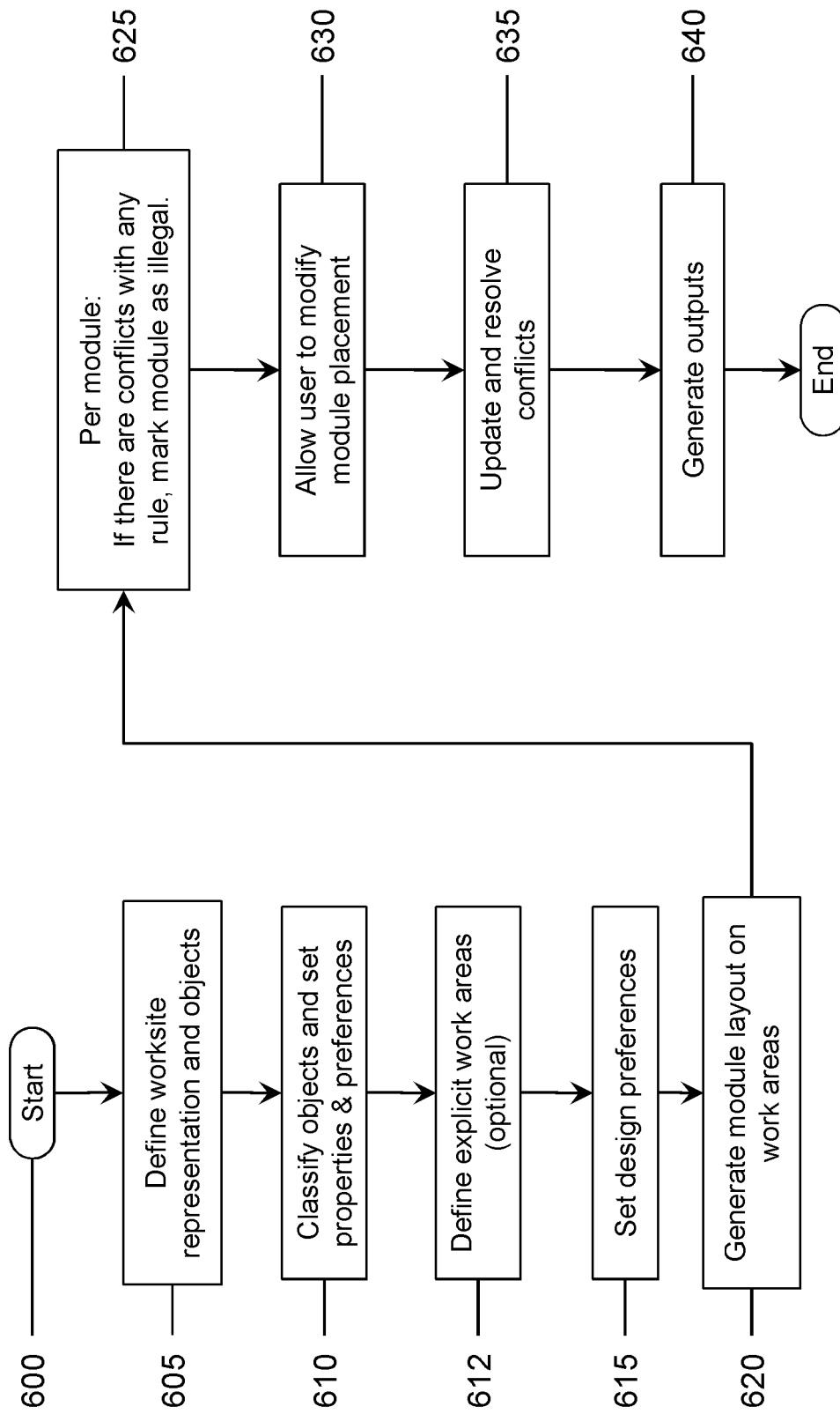
FIG. 6A is a flowchart illustrating a process by which a PV module layout, such as that illustrated in FIG. 5B, may be created using the software of an embodiment.

Under one such algorithm, as illustrated by the flowchart of FIG. 6A, a representation of a worksite, including any geometric objects, may first be defined (605) by gathering data on physical features (particularly dimension) at the worksite. This may be done at the worksite through the use of a GPS based surveying device, or, alternatively, CAD software may be used to create representative geometric objects. This step may be interleaved with step 610. At step 610, the objects in the representation may be classified as features and appropriate values may be set for feature properties. This may be done either manually by a user or automatically by the system through automated feature recognition. The user may classify one or more objects as features that provide regions in which layout of PV modules is allowed or preferred, such as fields or rooftops. At step 612, the user may specify one or more work areas, e.g., regions where PV module layout is preferred a priori, as by instructions from the owner. Explicit definitions of work areas are optional and are discussed further below. At 615, design preferences, project properties, and other encoded information, may be set or modified.

Figure 6B:
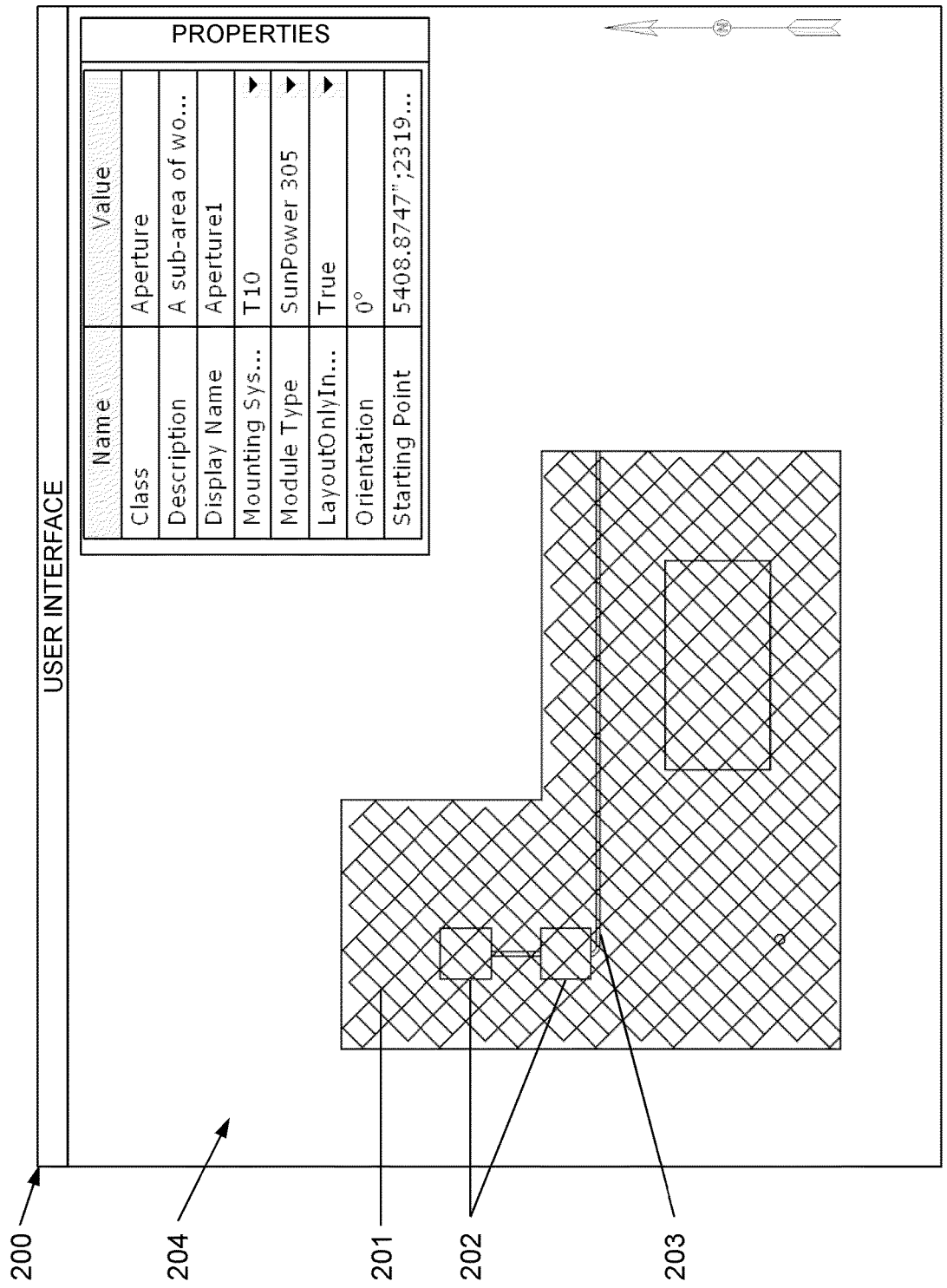
FIG. 6B illustrates the user interface of FIG. 5A, in which a PV module layout has been tiled across a rooftop, in accordance with an embodiment of the first pass of the process of FIG. 6A.

At 620, PV modules may first be tiled across one or more work areas, e.g., objects that are known to be "allowable" for placement, such as rooftop surfaces, without regard to obstructions or other interfering features (like exhaust fans). This may be operationalized, for instance, by placing PV modules across implicit work areas, e.g., across objects classified as features that support PV modules. The tiling may be performed by creating a grid or array in the defined space according to the relevant module design rules and properties. The tiling may be parametrically varied to include spacing between rows, or the amount of offset between adjacent rows or along regular or irregular edges such as a curving road or a property line. Additionally, the tiling may correspond to individual modules (with various individually-specified lengths or widths) or may represent collections of modules in arbitrary arrangements (e.g. as modules connected to the same mounting structure or tracking mechanism). Additionally, periodic interruption of tiling to accommodate service roads, mandatory fire access, or other types of design rules may be specified. In some embodiments, geometric objects corresponding to the module objects of the layout may be actually created and placed in the visual representation, as shown in FIG. 6B. Alternatively or additionally, the layout may be logical, in that modules are represented in a data structure. In either case, the geometric objects may be classified as instances of the relevant module type, with the particular feature properties and layout constraints associated therewith.

Returning to FIG. 6A, at 625, the system may then make a second pass over the tiled modules, marking as illegal any module whose placement conflicts with one or more design rules as applied to properties. So, for example, as shown in FIG. 6B, the entire surface of roof 201 may be tiled with modules. A second pass may then consider each module in turn and mark any modules that are placed illegally (i.e., not according to the rules of the representation and objects). This may be operationalized, for instance, by looping through each placed module, and, for each placed module, looping through all design rules, and applying relevant ones to find any conflicts. Thus, for example, any modules that are within the physical footprint of an exhaust fan 202, or within the setback footprint from the exhaust fan 202, may be marked illegal. Similarly, any modules within a certain distance of a high wind zone, e.g., FIG. 1 at 106, may be marked illegal. Illegal modules may be grayed out, automatically removed, moved to another layer, or otherwise changed relative to "legal" modules in the data structure. Marking may be explicit, as in an "illegal?" field or property in a software data structure, or may be implicit in the operation of the process. Illegal modules may or may not be left accessible to the user. Different levels of illegality may be maintained: for example, some modules may be strictly illegal, such that a designer cannot override their removal while other modules may be "softly" illegal or disfavored, such that a designer may be allowed to restore their placement. Different levels of legality may be maintained through the use of distinct colors, layers, and so forth. The result of the layout process is a PV module layout consistent with the design rules and properties for the worksite. As shown in FIG. 5B, the modules laid out at 530, illustrated in solid hatching, are legally placed. There are no modules located in the area referenced by 533, since that associated area is within the physical boundaries of an obstruction. The system may include the ability to select one or more otherwise-illegal modules and restore them to regular placement. In some cases, this may be performed in contravention of at least one of the rules as applied to the feature properties. The modules laid out at 535, and illustrated in grayed hatching, may be softly illegal, as they may violate an optional setback requirement. As discussed below, a designer may be allowed to "turn on" or reinstate such softly-illegal modules.

Some module placements may be illegal regardless of relationship with any other modules, such as where a module is placed too close to an exhaust fan. However, some illegal configurations may only be apparent relative to other modules and may therefore be identified recursively. For example, most grid-connected PV installations call for a pre-determined number of modules to be wired in electrical series. For example, when SunPower™ 305 modules are used in Northern California and connected to a 600 VDC inverter, exactly 12 modules must be connected in each series string.

As such, after eliminating "strictly" illegal modules, the system may perform additional "passes" of the remaining modules to perform a recursive or regressive check for additional modules that may fail design rules, such as inter-module connection rules. Such modules may be grayed out as in FIG. 5B.

Returning to FIG. 6A, at 630, after automatic generation of a layout, the user may be presented with an option to modify at least one of the objects or the project generally. User-interface controls to allow a user to modify placement are varied: Illegal modules may be placed on a separate layer of the representation and/or colored or styled differently, as in FIG. 5B. A user may change the layer of an illegal module to make it legal, or vice-versa. A user may right-click or otherwise select a module to change its status. A control may be provided to allow deletion of a legally-placed module, which may include absolute deletion or moving the module to a "deleted" layer. A deleted module may subsequently be restored if necessary. Controls to undo an action, or to redo an undone action, such as reinstatement of a module, may be provided. Undo and redo are discussed further below.

Controls may be provided to include the ability to change rules or categorizations and re-do the automatic layout. A modification component of a system may provide a user interface, or other mechanism, that allows replacement of a tile that had been placed but subsequently removed (e.g., according to a rule violation). Similarly, a mechanism may be provided to allow a placed module to be removed from a layout.

As shown at 635, user modification of the layout may cause the modified layout to be in an inconsistent state with respect to the relevant design rules and properties, or to otherwise have conflicts. For example, manual addition of a module by a user at a particular point may violate a design rule regarding setback. As such, modifications of a layout, such as addition, replacement, or removal, may cause re-calculation of a layout, recalculation of the routing/wiring scheme for a layout, etc. Modifications of the layout, or any inconsistencies with layout rules, may be noted on an exceptions list as discussed below in more detail. Some implementations may allow a user to disable any automatic re-calculation, and some implementations may allow re-calculation to be invoked by a user.

At 640, user interface controls may be provided so as to allow a user to perform additional actions with or upon a generated layout. For example, a layout may be saved, printed, and/or transmitted. Additionally, layout information, as well as rules and categorizations of objects, may be used to generate additional materials. For example, the performance, e.g., power output, of a particular module layout may be simulated using encoded information related to features in the representation, e.g., the efficiency of the user-selected model of solar collector and an energy-predication simulation rule relating to the amount of sunlight received by a roof area, such as latitude and/or height. Such results, e.g., simulation results, may be displayed or otherwise made available to a designer. As another example, the number and cost of modules and associated components (such as wiring and electrical inverters) may be tallied and used to generate a bill of material, cost estimates, invoices, etc. Multiple types of documents or deliverables, such as those noted in connection with typical layout design processes, may be automatically generated by some embodiments as a downstream output.

3. User-Defined Work Areas

The systems as described thus far have largely provided for layout of solar collectors, and particularly PV modules, over allowable surfaces or objects, such as roofs, through the use of implicit work areas defined by feature classifications. Additionally or alternatively, a system may provide a user interface to allow more fine-grained control over the layout process by giving the user explicit control over the definition and use of work areas as regions in which modules are allowed to be placed (notwithstanding violations of other design rules).

Figure 7A:
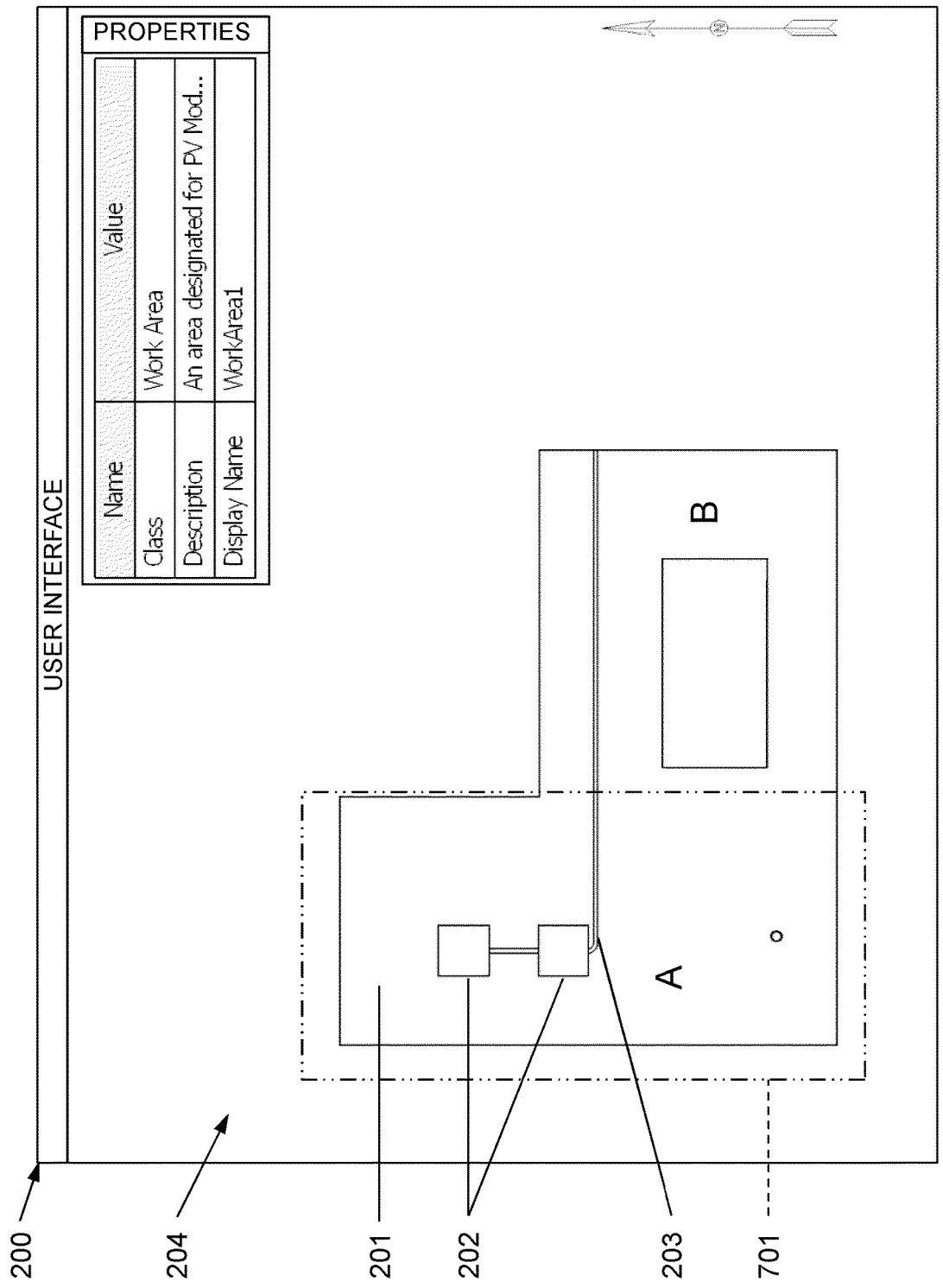
FIG. 7A illustrates the user interface of FIG. 5A, in which a user has created a "work area," one or more contiguous sub-area(s) within the worksite, a graphical representation indicating the owner's preference for where modules may be placed upon the worksite. This may occur, for example, if the worksite contains both undeveloped land and a building but the owner is only interested in placing modules on the building.

In particular, as illustrated in FIG. 7A, a system may allow a user to define one or more user-created boundaries for constraining or expanding module layout, e.g., explicit work areas. A work area may represent a boundary, extent, or set of allowable module installation regions corresponding to locations at the physical installation worksite. A work area may be coextensive with an object or set of objects corresponding to the physical installation worksite. Alternatively, a work area, such as that at 701, may cover only a portion of an otherwise-layout-allowable object. A work area may also span over multiple objects, and multiple work areas may be defined. An explicit work area 701 may be created by selecting a "work area" toolbar icon with a pointing device (e.g., mouse, touchpad, joystick or touch screen) or keyboard shortcut and subsequently drawing a rectangle, polyline, or other object. A user may define a work area by any method of defining a geometric object, including dragging a rectangle and clicking a "work area" toolbar icon or using a context menu. In the illustrated embodiment, objects may be marked (or otherwise associated) by a user as explicit work areas. A user-created work area may, but need not, be coextensive with any object, e.g., building surface or field, or the visual representation entirely. User-created work areas may be used in addition to, or in replacement of, implicit work areas.

Figure 7B:
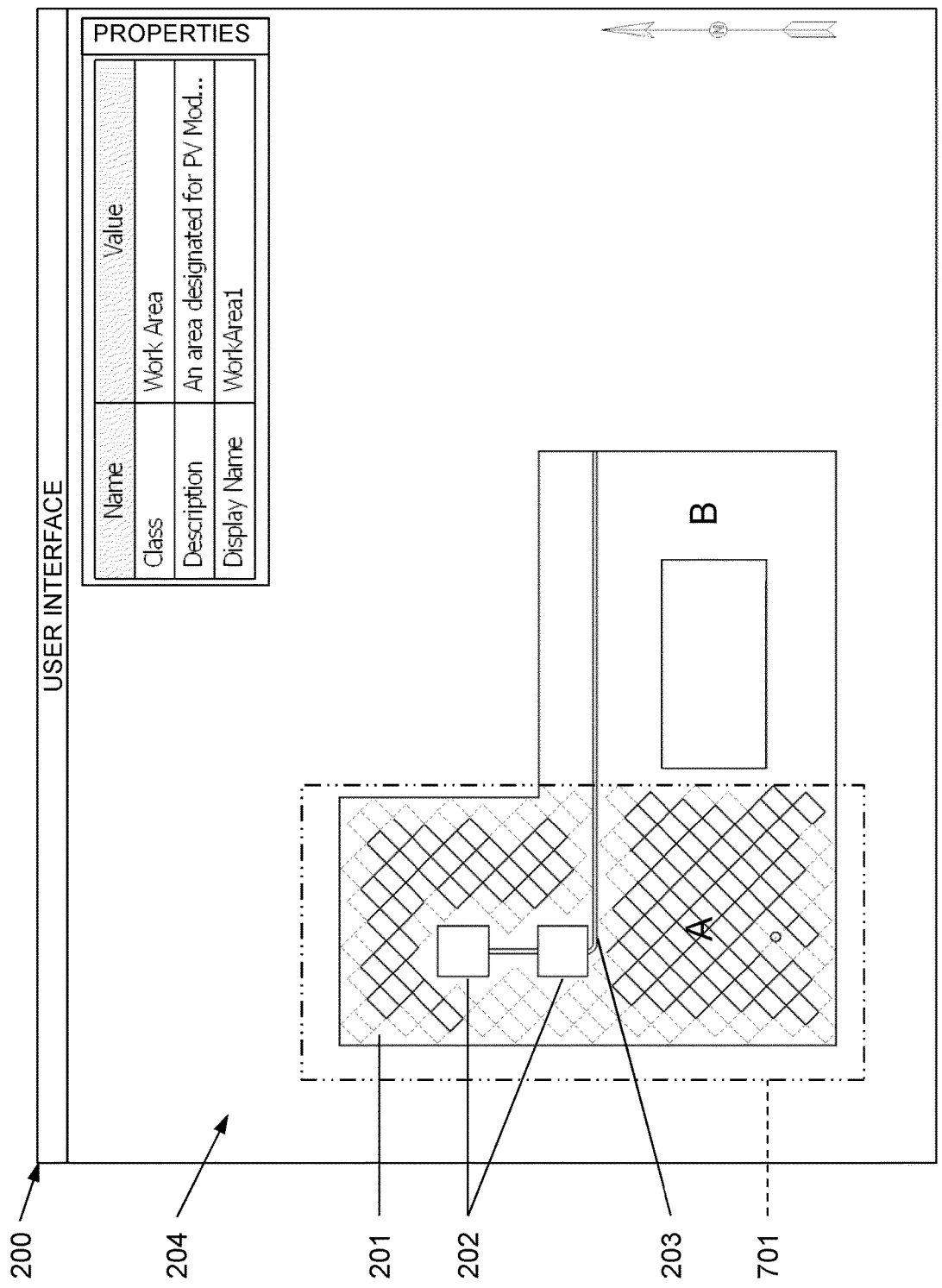
FIG. 7B illustrates the user interface of FIG. 7A, in which a PV module layout has been generated according to the work area properties, feature properties, layout constraints, design preferences, and other layout rules.

In some cases, a layout engine may be configured to place PV modules only in the intersection between an implicit work area, such as a roof or field and an explicit work area. In other cases, an explicit work area may define allowable placement areas without regard to (or in addition to) other placeable objects or implicit work areas. Explicit work areas may be used to override default placement rules for objects. This allows a designer to have greater control over where to place modules, such as whether to place modules on only a portion of a roof. For example, as shown in FIG. 7A, if a designer wished to consider placing objects only in western section of the roof 201, the designer could create a work area 701. In some cases, in the resulting layout, modules would be placed only in the intersection of the roof 201 and the work area 701. Thus, modules may be placed at location A (as consistent with other rules, such as those for conduit 203), but not at location B. One such layout is depicted in FIG. 7B.

One algorithm for implementing explicit work areas in the context of a layout engine is as follows: With reference to FIG. 6A, at 620, preferably modules are tiled only in locations that are contained within both a placeable object (such as a roof or a field) and an explicit work area. The method may then proceed as described previously. An alternative algorithm is to tile modules on all allowable surfaces and, at 625, subsequently mark or remove them if they fall partially or completely outside the boundaries of all explicit work areas.

Work areas may be modified by the user, such as by moving or otherwise adjusting a boundary of the work area. Modification of a work area may or may not cause automatic recalculation or regeneration of a previously generated layout.

4. Apertures

In addition or alternatively to work areas, a system may provide a user with the ability to define one or more boundaries for application of one or more localized sets of design preferences, e.g. layout apertures. Apertures allow a designer to create heterogeneous zones for the desired layout and may be used to provide another layer of control to the layout process. A layout engine as previously described may use a single set of design preferences (e.g., module type, orientation, start point, etc.) for laying out modules. Alternatively, a user interface may be provided with controls to allow a user to define one or more apertures, each of which may include a boundary. Multiple apertures may be associated with independent and heterogeneous sets of design preferences. Different apertures may have different extents; layout of PV modules within the boundary of an aperture may typically (with exceptions) be determined at least in part by the user-defined design preferences associated with the aperture.

Figure 8A:
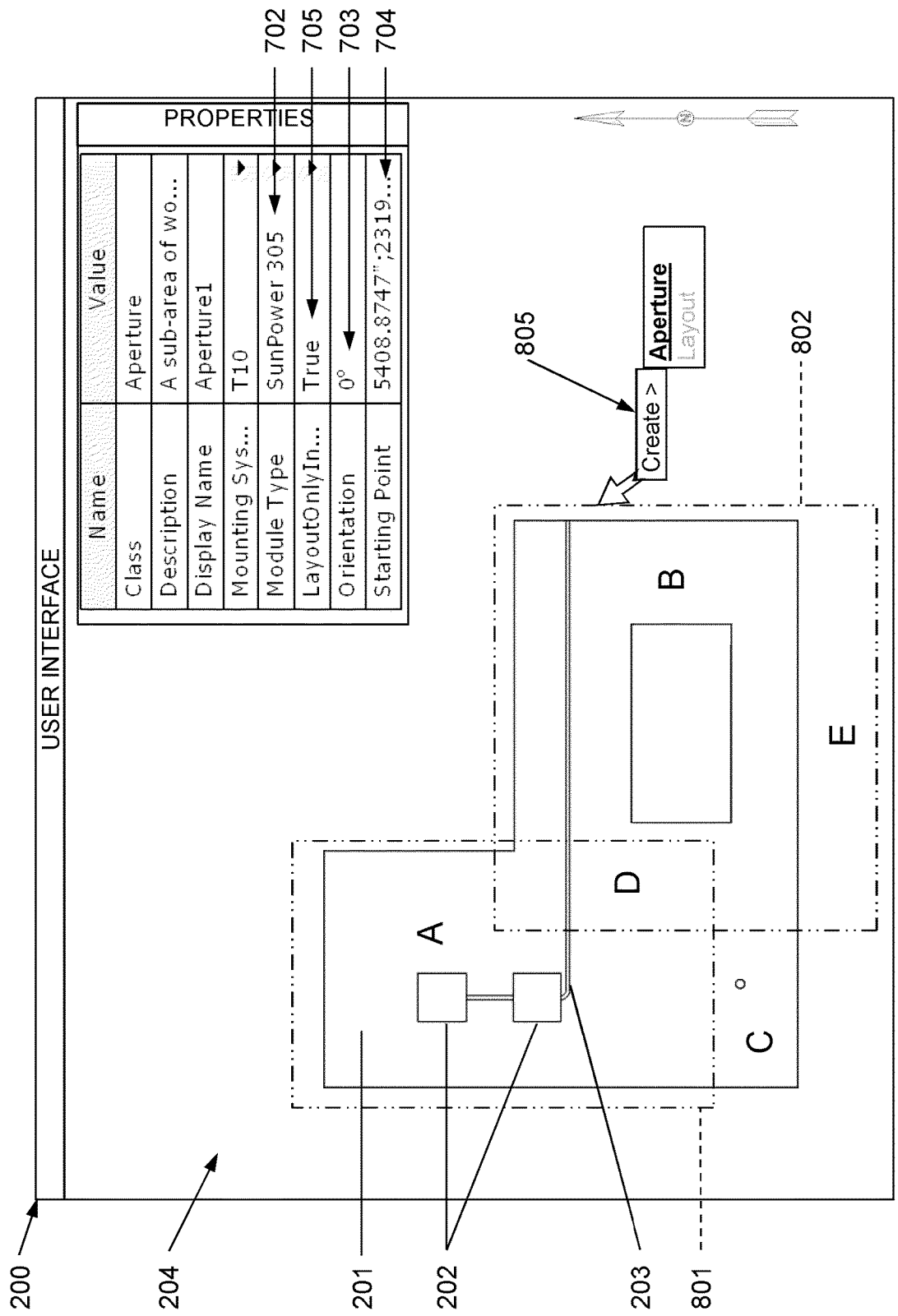
FIG. 8A illustrates the user interface of FIG. 5A, in which two user-created apertures and corresponding user-defined aperture design preferences have been defined.

As such, and as shown in FIG. 8A, a user may define a first aperture 801. The aperture boundary 801 may be coextensive with an object, such as a roof 201, and/or an explicit or implicit work area; or, as shown in FIG. 8A, the aperture boundary 801 may cover only a part of a placeable object, such as the roof 201. The aperture boundary 801 may also cover more than one work area and/or object onto which modules may be placed. The first aperture 801 may have a set of design preferences associated with it, as shown at 702-705. Aperture design preferences may include PV module type or model, module orientation to true north, inter-row and collector spacing, tilt angle, mounting method, string output voltage, inter-row offset and aperture size and shape, tile starting point, and other properties. (See Table V for additional examples.) In some embodiments, a user may modify some or all of the design preferences or may continue with the defaults. As mentioned above, a user may also define new module types or models and possibly other enumerated properties such as mounting methods while specifying an aperture's design preferences. These newly defined entities are advantageously available for subsequent use in the same manner as previously defined entities. A second aperture 802 may be created, and may similarly cover all or some portion of a work area and/or placeable object, such as roof 201. The second aperture 802 may have a different set of design preferences associated with it. Apertures may be created by the user, or may be automatically defined or pre-defined. For example, a general default aperture, covering the entirety of a particular work area or the entire representation of the worksite, may be initially defined as a default. Alternatively, the software may require a user to define at least one aperture before operation of the layout engine. An aperture may be created, for example, by selecting a geometric object and clicking a toolbox icon or using a context menu, as shown at 805. Multiple controls for adjusting aperture rules may be provided; for example, a user may be allowed to pick a linear reference object to be used as orientation of the module layout in the aperture.

Figure 8B:
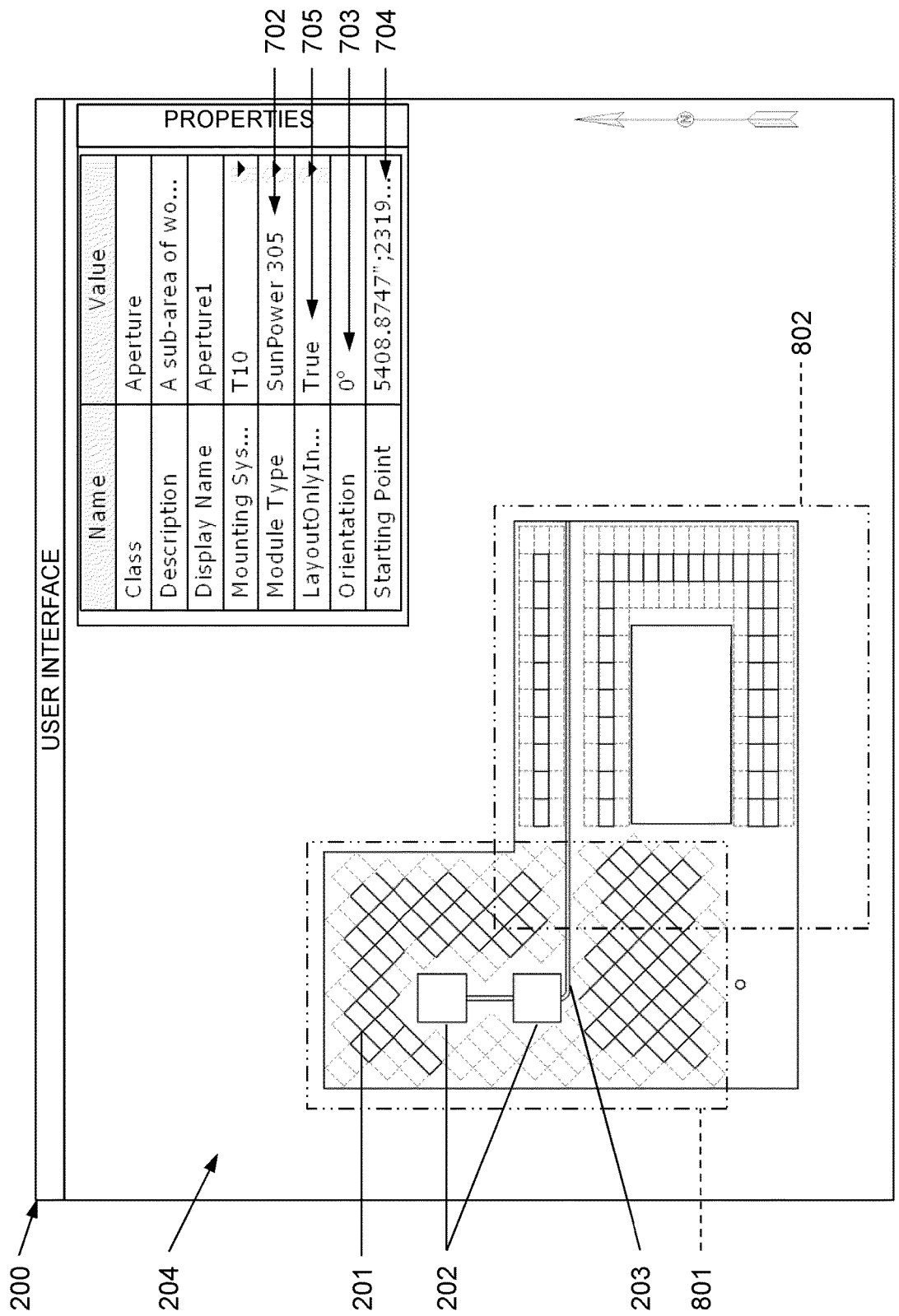
FIG. 8B illustrates the user interface of FIG. 8A, in which a PV module layout has been generated according to the aperture design preferences for each aperture, and in accordance with the project properties, feature properties, layout constraints, and other layout rules.

In some cases, the arrangement of modules placed in an intersection or overlap between an aperture and a work area will depend on the aperture's design preferences. So, for example, with reference to FIG. 8A, assume a work area coextensive with the roof 201 has been created (either implicitly or explicitly). When a layout engine is invoked, modules may be placed in location A according to the design preferences of the first aperture 801; modules may be placed in location B according to the design preferences associated with the second aperture 802; it may be that modules may not be placed in location C because C is not within an aperture (or they may be placed and marked as illegal). In some cases, apertures may overlap, as at location D, which means that two or more sets of aperture design preferences may apply to location D. In these situations, some systems will apply aperture conflict resolution rules, described in more detail further below in connection with FIG. 9. Modules may not be placed in Location E because Location E is not within a work area. FIG. 8B depicts an illustrative layout according to the foregoing, wherein the layout conflict in region D has been resolved in favor of the first aperture 801. Aperture conflict resolution rules are discussed in further detail below.

Apertures may be useful, for example, because they may allow a designer to specify one set of design preferences and properties for a first portion of a work area or object, such as a roof, and a second set of design preferences and properties for a second portion of the same work area or object, as shown in FIGS. 8A and 8B. So, for example, if solar collectors are to be placed on two sections of the same rooftop, but one section is flat while the other is sloped, a designer may choose two different mounting angles to the vertical, orientations relative to south, PV module models, and/or mounting systems appropriate to the two roof types. Similarly, if one side of a roof is particularly windy relative to another side, a user may create a first aperture for the windy side, using design preferences that include wind-tolerant modules and mounting systems, and a second aperture, using less-tolerant modules and mounting systems, for the less-windy portion of the roof. Apertures may also be moved or adjusted by a user (as with a user-defined work area), and this is one way such a system may provide the ability for a designer to quickly visualize alternative layouts.

Because apertures may provide differing sets of design preferences for module placement, overlapping or adjacent apertures may cause conflicts in placement. This overlap may be substantial. Aperture conflict resolution rules may be used to resolve inconsistencies in module placement. One simple form of conflict resolution rule is to rank apertures in creation-order, with either first- or last-created aperture having highest priority. Lexicographic order may also be used. A user may be provided with a control to explicitly change the aperture priority order. One method of doing this is to associate each aperture with a user-editable design preference defining its priority, e.g., "priority=2." A default aperture, if any, may have the lowest priority.

Numerous methods may be used to create modules layouts in accordance with the aperture conflict resolution rules. As an example, apertures may be given a priority as described above, and, in the case of a conflict in placement, priority is given to placement according to the higher-priority aperture.

For example, independent, partial layouts may be generated for all defined apertures, regardless of priority, according to the methods described above as applied primarily to objects and features falling at least partially within each aperture boundary. This computation may be performed in parallel. If no apertures overlap, the union of the two partial layouts may be taken as the 'final' layout and may be saved, stored, or rendered on an output device. If there is overlap, however, the conflicts between placed modules may be reconciled based on conflict resolution rules. In some cases, of the conflicting modules, those from the lower-priority aperture may be removed, thus modifying or adjusting the partial installation layout corresponding to the lower-priority aperture. As shown in FIG. 9A, one method of laying out involves, upon starting 900 the process, first inputting worksite data (e.g., physical dimensions of boundaries and structures) at 901; classifying objects and creating work area(s) and aperture(s) at 902; creating layouts of modules in each aperture at 904; analyzing each module in each aperture for conflicting placement with respect to other modules and/or other apertures at 906; using aperture priority rules to resolve any conflicts at 908, and allowing the user to modify module placement made according to the foregoing at 910. The process ends at 912, although it will be understood that numerous additional intervening processes and repetition of similar steps to the above can be conducted.

Another method of accomplishing this is to analyze each aperture in order of priority, from highest to lowest, and place modules as possible (according to the above) in that aperture, provided such placement is not inconsistent with modules that have already been placed as part of higher-priority apertures. Placement of PV modules will typically take place within the boundaries of a given aperture according to the design preferences of that aperture as applied to the features that intersect (or contain or are contained) within that aperture (as well as those that are outside that aperture but have, for example, setback rules), feature properties, module properties, and project properties. This method produces a set of successive installation layouts, where each successive layout is consistent with the design preferences of the present and all higher-priority apertures. Each of the successive installation layouts may be rendered or stored on a device or medium.

FIG. 9B illustrates another example process for laying out modules in accordance with classified objects, work areas, and conflicting apertures. After the start 930 of the process, at 931 a user may first classify objects and create one or more work areas and/or apertures (or default or implicit work areas and apertures may be used). In some embodiments, apertures may be associated with a relative sequence of creation that may determine their priority in subsequent conflict resolution.

At 932, modules may be placed according to the rules of the first aperture, where "first" may be determined by relative priority rules described above. Modules may be placed only within the boundaries of the first aperture and a work area, whether implicit or explicit. If explicit work areas are defined, modules may be placed only in the intersection(s) between an aperture, a placeable surface, and an explicit work area. If explicit work areas are not defined or not used, modules may be placed in the intersection of an aperture and a work area defined by a placeable object, such as a roof. At 933, modules that conflict with one or more design rules, such as violating setback requirements for exhaust fans, are marked illegal, and thereafter removed or otherwise taken out of the active layout.

At 934, the steps 932 and 933 may be repeated for a second-highest-priority aperture (if any). However, in some cases, in addition to the usual requirements of intersection with a work area, modules may only be placed in the second aperture if they do not conflict with modules already placed in the first aperture. This may be accomplished in the equivalent to the placement stage (932), e.g., never placing modules that conflict with the first aperture. Alternatively, modules may be placed across the second aperture without regard to the first aperture's modules or design preferences, and subsequently removed (during the equivalent of step 933) if found to be conflicting with the modules placed in the first aperture (or the design preferences pertaining thereto).

At 935, steps 932 and 933 may be repeated for a third-highest-priority aperture (if any). Modules may be placed in the third aperture, and according to the rules of the third aperture, but only if they do not conflict with modules placed in the first or second apertures or design preferences thereof. This process can be repeated optionally, as shown at 936, for all remaining apertures in turn. At 937, or at an earlier time, a user may be allowed to modify module placement, which may lead to regeneration of all or part of a layout, based upon the steps described above. As noted above, additional intervening steps may be taken, and any of the above steps repeated as desired before the process ends at 938. The final layout may be displayed on a computing device or otherwise rendered or stored.

5. Project Hierarchy and Storage

A solar installation project design, including a representation of a project worksite, features and their classifications, and a layout of solar collectors, may be characterized by project state information. Project state information includes, generally speaking, the information that can be used to re-create, without more, a particular solar collector installation design. So, for example a typical use of project state information is to allow a design to be saved in a non-volatile memory. Invoking a "save" function or control on a particular design may cause project state information to be written to a hard disk. The software program may then be terminated (clearing all of its working memory) and restarted. A user may then select an "open" function or control and point the software to the saved project state information. The software may then load and operate upon the project state information to re-create the solar installation project.

In some cases, the entire contents of the software's working memory when displaying a particular design can be recognized as "project state information," since such is enough to fully specify a particular design. However, one advantage of using project state information is that one may use only a subset of the working memory (or even other data), thus reducing both the size and the complexity of the project state information. For example, a given design may include a layout of one million collectors, all of which are of the T10 module type, and laid out in a 1000×1000 sub-array. One way of storing such a design is, e.g., to allocate and store one million "collector" data structures, each with their own copies of relevant properties (such as "Module Type=T10," location, orientation, etc.) Alternatively, a system might simply store state information along the lines of "1000×1000 sub-array of T10 modules, oriented 0 degrees." This more compact representation of project state information may be more convenient to store and easier to modify. For example, if a designer were to change the module type for all the modules from T10 to something else, performing that change may call for a scan and change to one million data structures under the first example. Under the second, however, only a single change to the state information may accomplish the modification.

In some embodiments, project state information for a given design will include all of the design inputs, e.g., the data used to regenerate the design. So, for example, project state information may include input information such as the representation of a worksite including geometric objects, classifications of these geometric objects as features, feature properties for each of the classified objects, design preferences, work area definitions, aperture definitions and attendant design preferences, project properties, etc. Project state information may also include other types of inputs, such as user modifications to generated layout information. For example, when a user manually adds a module to a generated layout, such as when the user changes the status of a particular module from "illegal" to "legal," that module's status may be reflected in project state information.

Project state information may also include output information, such as generated layouts, performance and cost characteristics of same, etc. For example, a bill of materials for a particular design is an output of the design, since it is a function of the inputs of the design, e.g., design preferences. This may allow, for example, caching of output information to reduce computational demands.

Efficient management of project state information can be difficult. In particular, in some embodiments, project state information may provide for "conflicting" information, such as when a user places a PowerGuard module within an aperture boundary designated as T10. If the system is to give effect to both of these actions by the user, it may be useful to have an efficient and powerful representation of project state information.

Accordingly, in some embodiments, the project state information may be recognized as an arrangement of hierarchical elements, which may be represented in a data structure. In some situations, the hierarchy may approach a tree-like structure, in which sub-elements are assigned a unique parent object. In other cases, the hierarchy may be an instance of a more general graph, such as when a particular object has more than one parent object in the hierarchy.

Figure 10A:
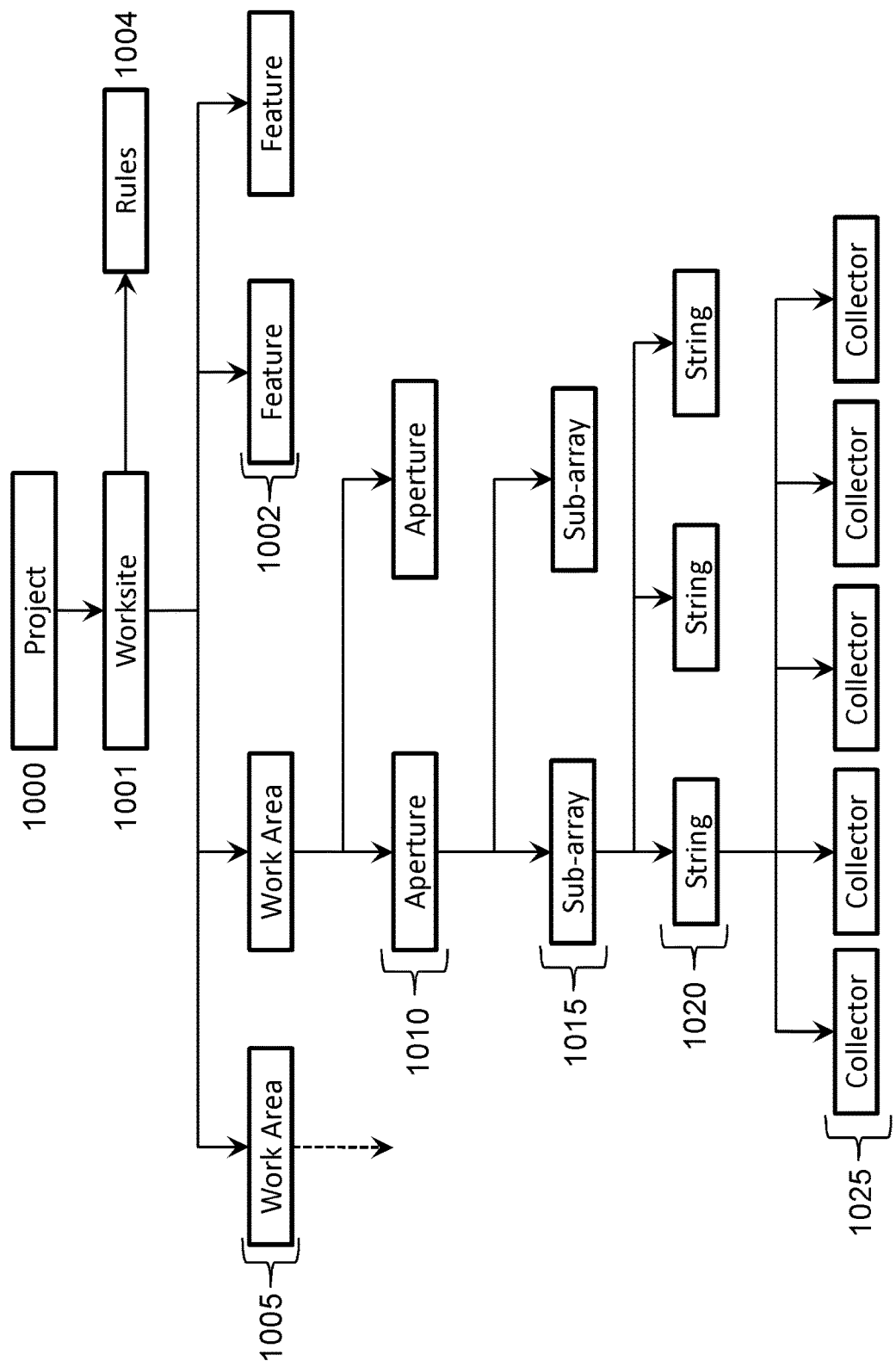

FIGS. 10A-B provide an illustration of a project state information hierarchy that may be used by a solar collector layout design tool. In particular, as shown in FIG. 10A, an overall project 1000 may contain a worksite representation 1001, which may include one or more features 1002. Each of the features 1002 themselves may contain feature properties.

A worksite representation may also include work areas 1005, such as the two work areas illustrated in FIG. 10A. Each work area 1005 may contain one or more apertures 1010; e.g., the first work area 1005 may contain two apertures at 1010. This may be the case if, in a worksite representation, an aperture 1010 falls within the boundaries of a given work area 1005. In the case of a single aperture that overlaps multiple work areas, the aperture object 1010 may be shared between or duplicated among the work areas. Alternatively, the hierarchy may be adjusted to use work area-aperture intersections (rather than entire apertures) as the child object for work areas 1005.

As discussed above, according to some embodiments, solar collectors will be placed in the intersections between aperture 1010 and work area 1005. As such, each aperture or work area-aperture intersection may include one or more sub-arrays 1015 of collectors within the apertures 1010. The number and composition of sub-arrays 1015 in a given aperture 1010 may be a function of multiple variables, including obstruction features located within or around (in the proximity of) the boundaries of the apertures. For example, a linear obstruction (such as a wall) that bisects an aperture may cause the layout of collectors within the aperture 1010 to be divided between two sub-arrays 1015, one on each side of the wall. Some embodiments may cause sub-arrays 1015 to have rectangular shapes, other embodiments may create a sub-array 1015 out of each contiguous group of collectors in an aperture 1010, regardless of shape. Still other embodiments may utilize other rules 1004, such as wiring or output requirements, to form sub-arrays 1015.

A given sub-array 1015 may be further divided into strings 1020 of collectors 1025. In some situations, as may be the case with PV modules and as discussed above, depending on the selected model, a given number of collectors may need to be wired together in a particular fashion, e.g., in series, in order to produce a required output voltage. So, for example, if the required output voltage of a given sub-array is 150V at peak power, and if the particular modules being used to form the sub-array each put out 15V at peak, then the modules may be grouped into strings of 10 modules each for installation. The collectors of each string may be wired in series, and each string of a sub-array may be wired in parallel to the other strings of the sub-array. Accordingly, a given sub-array 1010 may be composed of multiple strings 1020. Each of these strings 1020 may be composed of collectors 1025.

As shown in FIG. 10B, a given solar collector may be itself be composed of a hierarchy of elements. For example, a PV module may be composed of cell strings 1030, each of which includes a series of cells 1035 (just as an sub-array 1015 may be composed of strings 1020 of modules 1025 as shown in FIG. 10A). For example, a 15V module may be composed of three cell strings wired in parallel, where each cell string contains ten 1.5V cells wired in series.

Each of the elements at each level of the hierarchy may be associated with a set of properties. For example, the properties of a given string may include module count, string location, etc. Some of the possible properties that may be associated with particular work areas, apertures, projects, and features have been illustrated above. The properties of an element may be represented absolutely or with reference to another set of properties. For example, default values for properties may be inherited from parent elements in a data structure representing the hierarchy, and those default values may be overridden by values for properties stored with a given child.

Like properties, design rules such as feature layout rules employed by the layout engine may be associated with the respective elements in the hierarchy. Design rules that are not specific to particular instances of features may be associated with the project or worksite generally, as shown in FIG. 10A at 1004. Design rules may also be inherent to a particular layout or design engine or otherwise not represented in the project state information hierarchy. Similarly, design preferences may also be associated with respective elements in the hierarchy: Project design preferences may be associated with a project element. The hierarchical data structure also provides flexibility in the categorization of properties, design preference, and rules: E.g., collectors placed or modified by a user may be classified as features 1002 with attendant properties, may be maintained at a separate level of the hierarchy (as shown at 1025) or both.

In some embodiments, the data structure used by the software to represent project state information, for example, to use for storing and retrieving projects, may be represented as a hierarchical relationship among a collection of elements, the properties, and the design rules associated therewith. For example, project state information may be represented in an XML-type format, wherein a top-level worksite node may contain a listing of features and their classifications. The worksite node may also contain a number of work area nodes, which may, in turn, contain a number of aperture nodes. Each aperture mode may contain sub-array nodes, and so forth. A project hierarchy data structure may represent the state of a design project, in the sense that sufficient information to regenerate a layout may be contained within the data structure.

6. Project Exceptions

In some embodiments, as a designer goes through the process of classifying features, generating layouts, and then modifying those layouts, as discussed above, metadata about the design process may be generated. Metadata may be determined from the rules that are applied to project state information, such as feature properties, design preferences, version information, etc. This metadata may take many forms, and may include information about actions the designer has taken, actions the designer should take, and design information that may be useful to supervisors, co-designers, and downstream users and recipients of the design. The metadata, and other data, may be used by a system to generate a list of "exceptions" that may encode one or more exceptional conditions in the metadata, e.g., a violation of a rule by the project state information per se, the project state information as reflected in a design output, or some other condition. Exceptional conditions, and corresponding exceptions, may be related to omissions by the user, violations of regulations, violations of solar collector manufacturer specifications, violations of client requirements, violations of engineering principles, violations of physical space constraints, violations of company engineering policy, etc.

Such a list may allow a designer to have more flexibility in the sequence of actions to perform when generating an installation design while still ensuring that the proper actions will be performed eventually and that exceptional conditions, such as design flaws, are not overlooked. In particular, rather than being forced to perform workflow in a certain order, an exceptions list may allow a designer to perform actions in an order of his or her choosing. The exceptions list may be presented to a user without requiring the user to address any of the exceptions (or exceptional conditions) before performing another action. An exceptions list may also provide the ability for a designer to decide whether (or not) to address a particular exception An exceptions list may also provide a simple interface to important information about a design, such as questionable module placement, etc. Thus, a user is allowed to effectively ignore (at least temporarily) an exception, to be dealt with at the user's schedule as part of a "To Do" list. An embodiment may provide an option to a user to ignore a given exception by, for example, making the exception or exception list non-blocking in the user interface. The user is also given the options to comply with the software's expectations for the exceptional condition, such as by providing missing information or removing illegal modules from a generated or user-modified layout. Metadata and exceptions may also be useful for maintaining and generating downstream documents, such as contract exclusions.

In some embodiments, some or all of this metadata, including exceptions, may be associated with the design, such as by common storage or reference with the data structure hierarchy discussed above. Thereafter, downstream users and processors of the design, including automated systems, may use the metadata. The metadata may also be summarized, exported, translated, or otherwise operated upon by the system. Metadata, and exceptions generated therefrom, may include, among other things, information about contractual exclusions, warnings to the designer, and errors in the worksite representation or layout.

As illustrated in FIG. 11, a user interface 1100 may be provided such that some or all of the metadata about the design may be presented to the designer in the form of a list 1105 of exceptions. The representation may include a layout, a list of design exceptions, and controls operable to interact with the exceptions. An exception may indicate that some action on the part of the designer is called for. In some cases and for some exceptions, although an exception may be generated, the designer might not be impeded in the design process for failure to supply the requested information. For example, in some embodiments, the location of the worksite, perhaps as approximated by zip code, is a worksite property that impacts layout. This may be the case where different zip codes imply different regulatory regimes, e.g., different requirements for rooftop loading, setbacks, and so forth. Accordingly, the design rules may request the supply of a zip code. In such a case, if a designer has failed to specify a zip code for the worksite, that failure may be noted as metadata about the design and a zip code exception 1110 may be generated. During the pendency of the zip code exception 1110, the designer may still be allowed to classify objects and generate a layout or downstream documents, perhaps using a default zip code or regulatory regime supplied by the system Alternatively, the system may allow the designer to perform some non-related actions while an exception exists, but may require that the designer address the exception before a particular action, such as layout generation, simulation, or downstream document generation is allowed. For example, the designer may be allowed to continue classifying objects before entering a zip code, but may be precluded from generating a layout. As another example, other metadata may indicate fatal conditions, in that continuation with the design is not an option. For example, if a designer places a module over an exhaust fan, the system may generate an error exception 1115. The designer may address the exception 1115 before a finalized design may be created. If the user has not addressed an exception (i.e., ignored it), it may remain in the exceptions list 1105 for supervisor review. Some types of addressing by the user, e.g., compliance with the requested or change, can remove the item from the exceptions list. Other types of addressing by the user, e.g., overriding or otherwise explicit refusal to comply with the requested information or change, results in modification of the exception and maintenance of the exception and the user override input in an exceptions history, which will be useful for future modification, supervisor review, contract generations, etc. Other types of exceptions are discussed below.

A designer may interact with exceptions that call for designer action in a variety of ways. For example, the designer may choose to address the zip code exception 1110 by entering a zip code for the worksite. This may be done in several ways, including through the mechanisms described above for entering project properties. Alternatively, the exception 1110 itself may be associated with a mechanism for addressing it. For example, a zip code exception 1110 may include a field into which a zip code may be entered and thereby associated with the project. When the user addresses an exception, it may cause the system to recalculate or regenerate information. For example, when the user enters a value into the zip code exception, the system may validate the zip code and may, for example, regenerate a layout with the new location information. In response to an exception, a user may provide compliance information sufficient to remedy the exceptional condition or rule violation, which information may include, for example, a project property, a customer property, a feature property, a design preference, a work area boundary, or an aperture boundary. Some embodiments may recognize the compliance information and use the information to modify project sate information or other design information. After receiving the compliance information, the system may remove the corresponding exception A system may include also exceptions that reflect information or metadata about a design that may be useful for downstream users and processes. For example, if a designer places a module in a configuration that overlaps with a feature classified as an "illegal wind zone" (as may have been determined by an on-site inspector), an exclusion exception 1120 may be generated. These exclusion exceptions may be presented to the designer, as discussed above, and the designer may operate upon a control to comply with, e.g., remove or ameliorate, the exception (by, for example, removing the particular module in question). Alternatively or additionally, some exceptions, including some exclusion exceptions, may be maintained with or associated with the design and, thereby, made available to subsequent processes that use the design. For example, another software program may use the exclusion exception information to generate a list of contractual exceptions that may be listed as part of the terms of a contract between a designer and a client. So, for example, the exception 1120 corresponding to the module placed in the leaky roof region may be used by a downstream process to generate a specific term for a contract that limits the designer's warranty for the module placed in the leaky roof region or disclaims liability for certain ensuing damage. Exceptions may also trigger the inclusion of terms relating to price, as exemplified by an exception that may be raised when the total cost of the project exceeds the budgeted cost and a term to that effect is added to the contract. Exceptions may also trigger the inclusion of terms relating to the scope of work, as when modules are laid out on or in proximity to an obstruction and the response to the exception is to indicate that the customer is responsible for removing or modifying the source of the obstruction so as to make the design acceptable.

Some exceptions may also be designed to require review and additional authorization from a person or authority other than the designer. For example, an exception 1125 related to having a roof loaded to 95% of its maximum designed weight capacity may require approval of a designer's supervisor. The exception may require approval by the supervisor or other second user before the designer may continue, at least with respect to certain designated actions. Alternatively, the system may produce a listing corresponding to all such approval-entailing exceptions, and such a listing may be used as part of the downstream process for the design, thus allowing the user to proceed with at least some tasks despite the exception. Later compliance, overriding, or authorization of overriding of the exception (e.g., by a supervisor) may regenerate an associated solar collector layout, such that the intervening work by the user is not wasted.

Some embodiments may implement some or all of a combination of the above exceptions and actions. For example, depending on the exception, legitimate actions made available to the designer by the system may include variations on "ignore exception," "automatically fix layout," "override exception," "delete collector(s)," "regenerate layout," "enter value and recalculate," "flag for supervisor," "comply with exception," and so forth. For example, a user may issue a command, as by software control, for a system to takes steps to automatically attempt to rectify an exceptional condition, as by modifying project state information or a design in accordance with removing the exception condition.

Some embodiments may make a record of user actions, including those taken as part of addressing an exception, including user authorizations. Records of actions may be associated with exceptions, stored with a given project, exported to a downstream user, and so forth. Other embodiments may be configured to re-evaluate the presence of exceptional conditions, with or without user input or impetus; as such, if an exceptional condition is no longer present, the system may remove the exception.

Figure 12:
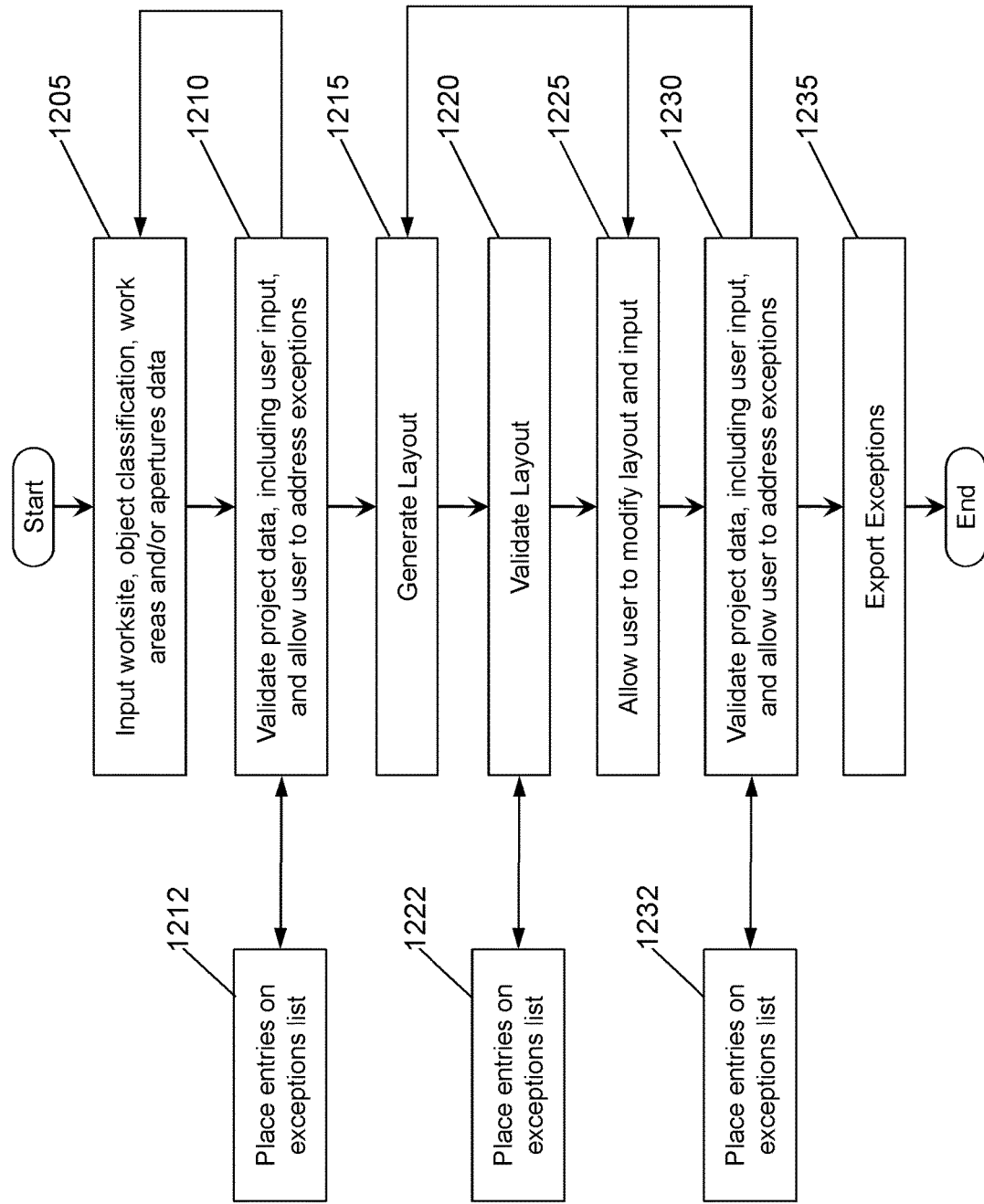
FIG. 12 is a flow chart illustrating a process by which user inputs and resultant layouts may be validated and exceptions may be generated.

FIG. 12 illustrates a process for implementing exceptions. At 1205-10, the system may enter an input-validation loop. At 1205, a designer may input worksite information, classify objects as features, and enter feature properties and other design properties and preferences. At 1210, the system may analyze and validate the designer's input, as by applying rules to the geometric objects and other input information in the project state information. A validation engine may use validation rules that are specific to the type of project or may be generalized. Such validation rules may be stored with the project hierarchy or may be external to the project. As any variances are noted by the validation engine, they may be placed in a list of exceptions, e.g., in a data structure in computer memory, at 1212. These exceptions may be displayed to the user as described above. The user may choose to address exceptions that have been placed on the exceptions list; alternatively, the user may input more properties, classifications, and other information.

The input-validation loop 1205-10 may continue until the user causes a layout to be generated, as at 1215. This may cause the system to enter a layout-validate-modify loop 1215-20-25-30. As shown at 1220, the resulting layout may be analyzed and validated for conformance to the design preferences, feature and project properties, layout rules, desired outputs, and other encoded information criteria. Any variations or deviations arising from the generated layout may again be noted as exceptions and placed on an exceptions list, at 1222. At 1225, the user may be presented with the ability to modify the layout as discussed above. This may include changing properties or preferences, addressing exceptions (which may cause a change in properties or in the layout), adding or deleting modules, and so forth.

As shown at 1230, the user's actions may be validated by the validation engine. At 1232, exceptions caused by the user's actions may again be added to a list of exceptions. In some cases, changes made by the user may trigger regeneration of the layout. For example, if the user increases a setback property, the layout may be regenerated to be consistent with that increased setback. Depending on the type of exception, the 1225-30 loop (where user entries are validated and exceptions generated without a regeneration of a layout) or the 1215-20-25-30 loop (where user entries cause a regeneration of the layout) may be repeated as necessary or desired by the designer.

At 1235, some or all of the metadata generated through this process, including exceptions and the actions taken to address them, if any, may be stored or otherwise made available for downstream users. For example, a list of contract terms may be generated from all of the contract exclusion exceptions and a list of all of the approval-required exceptions may be generated and forwarded to the appropriate approval entity. A user interface may provide a list of contract exceptions corresponding to exceptional conditions related to violation of a design rule by the solar collector installation design, where the contract exceptions or conditions provide information sufficient to identify a term for inclusion in a contract. In general, any metadata, exception, or action by the user may be included as part of the project state information.

7. Project Versions

Some embodiments may provide a system and user interface for viewing, creating, and manipulating multiple versions of a solar collector layout design for a particular installation worksite. The use of versions may allow, for example, a designer to view layouts and other outputs from selecting alternative modules, alternative feature classifications, alternative work area and/or aperture boundaries, and other types of alternative inputs or design preferences quickly and easily. These versions provide the designer with the ability to view output changes from various input changes interactively. Some embodiments may allow the designer to quickly move from one version to another, while others may allow a designer to affect multiple versions with one action. A given version may include user-defined project state information that provides a unique set of user-defined design preferences, feature properties, and project properties. Different versions with different sets of this input information may correspond to alternative solar collector installation layouts, where the alternative layout for each version results from differences between the unique sets of data. The unique sets of data may also include work area state information, aperture state information, geometric object information, etc.

In some embodiments, different versions of a given installation project will share worksite and/or feature information, including properties. Such versions may define possibly-differing work areas, apertures, and layouts. In other embodiments, versions might not share all feature information and, therefore, differing versions may have different features, classifications, or feature properties. Versions may share input project state information of various types, including geometric objects, object classifications, and feature properties, project properties, among others. Versions may share data by maintaining coherency between separate data sets. This may be accomplished by having multiple versions reference the same copy of shared project state information, as by referencing the same location in memory, as by a pointer. Each type of input data, such as design preferences, feature properties, project properties, etc., may be bifurcated, where one or more of the individual data are shared and/or one or more are not shared.

Related versions may share information at one or more levels of the hierarchy described above in connection with FIGS. 10A-B. For example, a set of related versions may share a common description of a worksite, its physical characteristics, including features, and classifications of features. Versions may branch off from each other at any point in the hierarchy. In the case of a tree-like hierarchy, elements above the branch point may be shared among the versions, such that changes to an above-branch datum may be applicable to both versions. Alternatively, two or more copies of below-branch data may be maintained, one for each version, such that change to a below-branch datum in one version may not impact the corresponding datum in the other version (if any).

Figure 13:
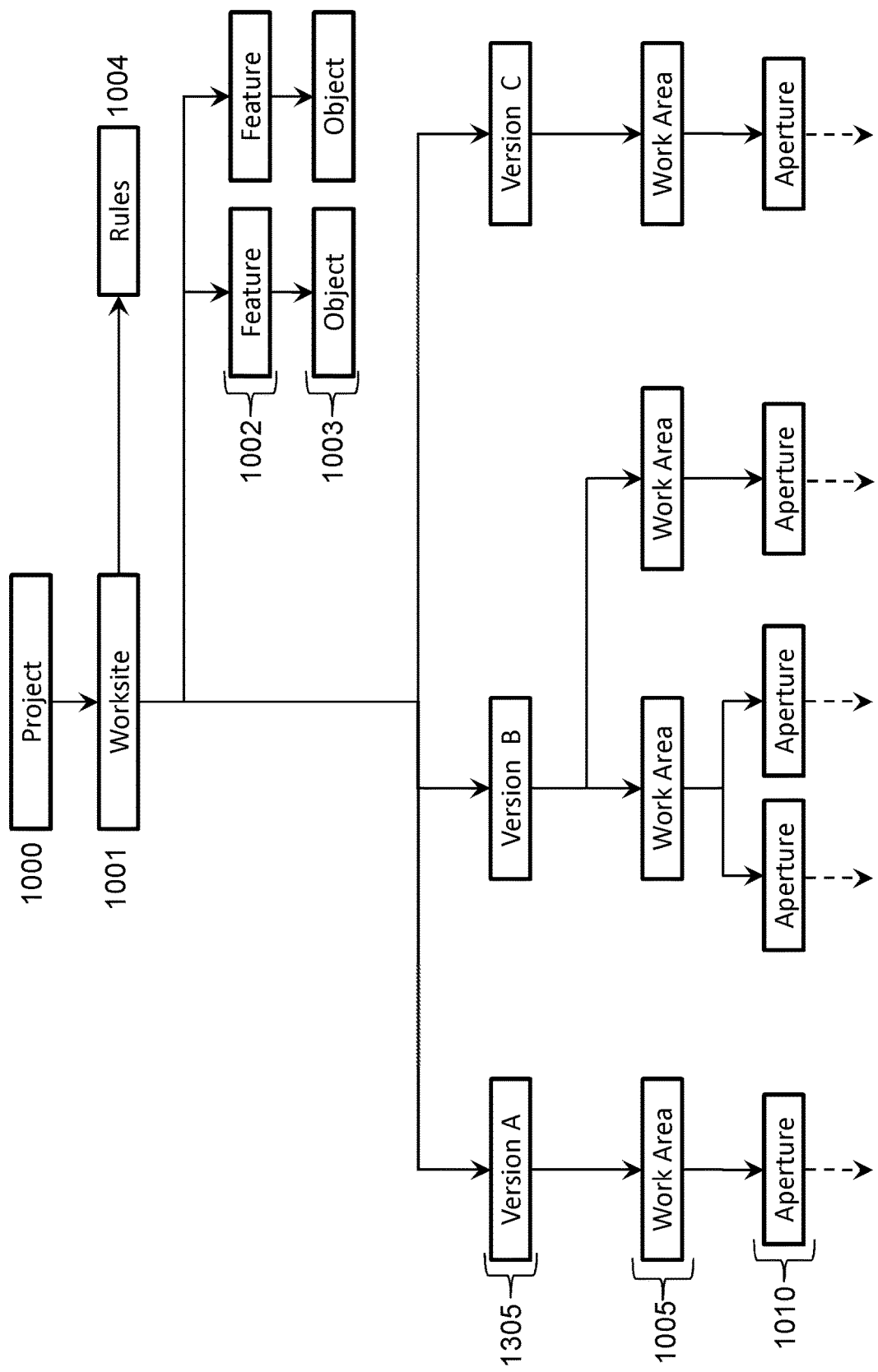
FIG. 13 illustrates the hierarchy of project elements of FIG. 10A, expanded to include partial depictions of multiple versions of layouts generated by the software, as may be created in response to user selections of alternative design preferences, aperture locations, etc.

In some embodiments the branch point among versions may be at the work area level. For example, FIG. 13 illustrates three versions at 1305. The versions 1305 are illustrated as depending from, and thereby sharing, a worksite and, thus, the versions may share several sets of encoded information, including design rules 1004, some or all features 1002 and their classifications and properties, etc. In such a situation, a single change made to the worksite 1001 or features 1002, such as a re-classification of a geometric object to another type of feature, a change in a feature property, etc., will be applicable to, inherently part of, and thereby reflected in, all three versions 1305. In another example, each version 1305 may contain distinct and independent work areas 1005, apertures 1010, and related sub-elements generated by the layout engine (such as sub-arrays, etc., which are not shown). In this case, changes made to a work area, aperture, or sub-element (such as a manual placement of a particular module, or a change in the wiring pattern of a string), may be applicable only to the version in which the change is made. This may be useful because a designer may wish the project description, such as feature classifications, to be invariant across all versions. Rather than forcing a designer to manually update multiple versions manually with a single change in a feature property, a system that provides shared classifications among versions is arranged to "automatically" update all related versions.

In this way, a project data structure may include alternative versions of the design, where each alternative version includes independent (non-shared) project state information and shared project state information as described above. The (non-shared) independent project state information differs for each version. As such, when taken in combination with shared project state information, the state information may define an installation design that differs among the differing versions.

Some embodiments may allow branching between versions at higher or lower levels of a hierarchy. For instance, versions may branch at the highest level of the hierarchy, whereby versions do not share any common features, including feature classifications. Alternatively, versions may branch at a low level, e.g., at the string level for a particular sub-array, e.g., if one version has modules grouped in strings in north-south rows, while the alternative version has modules grouped primarily into east-west rows. In such a case, the two versions may share elements above the branch points (such as general aperture design preferences), such that a change in the aperture settings of one version will affect the other version.

Figure 14:
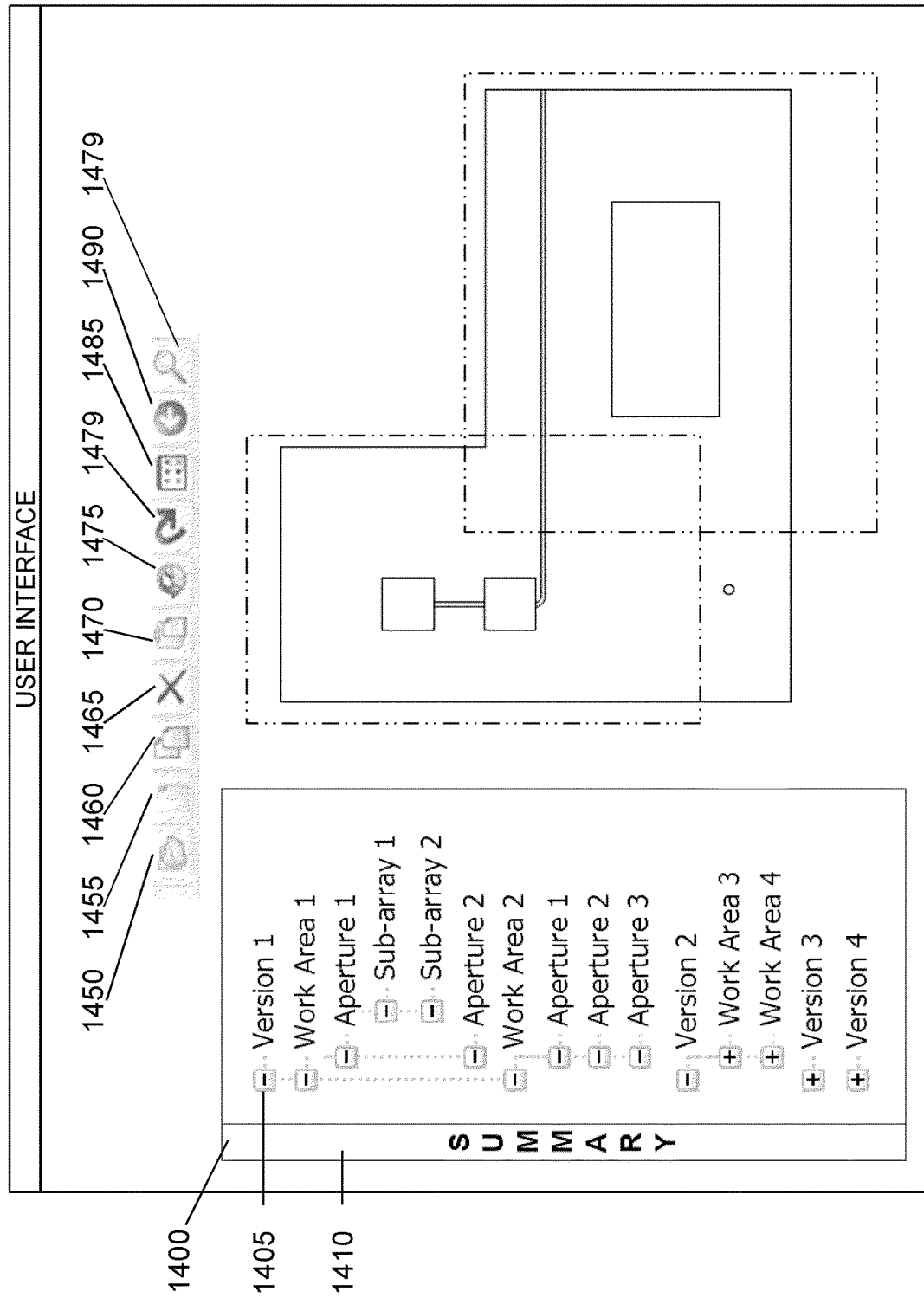
FIG. 14 schematically illustrates a user interface including a list of versions for the project design and controls for operating upon versions.

As shown in FIG. 14, systems in accordance with some embodiments may provide a user interface for viewing, creating, modifying, and operating with different versions. In particular, a listing 1400 of one or more versions may be provided. The listing 1400 may reflect one or more levels of hierarchy particular to a given version, as illustrated here with respect to "Version 1." The interface may provide a mechanism, such as a toolbox control 1450, whereby a version may be activated (or selected) for display or other operation in the user interface. If levels of hierarchy are displayed, as shown for Version 1 at 1405, a control may be provided to allow a user to select a sub-element, such as the first aperture 1410 of Version 1 1405 and thereby to cause an operation upon that sub-element, such as highlighting in the visual representation, display of a properties box (not shown), summary information and so forth. The listing 1400 may reflect or illustrate the branch points of various versions.

When a version is activated, the contents of the version may be displayed in a visual representation. For example, when a version is activated, the aperture, work area, features properties, module layout, exceptions, and so forth corresponding to that version may be displayed. Activation of a version may cause the layout engine to recalculate the layout corresponding to the version (consistent with the version's properties). Activation may also cause information about the version, such as summary information, to be displayed, such as in a status line or field. As worksite features are created and classified, and as layouts, exceptions, and so forth are generated, those properties and exceptions may be associated with the presently activated version.

When a change is made to the activated version, if that change is made to an element that is shared with other versions, that change may be reflected in the other versions as well. So, for example, if two versions share feature classification information as described above, then re-classification of a given feature of the worksite or modification of its properties may impact both versions. A change that is reflected in a non-activated version may cause recalculation of a layout associated with that version. For information that is not shared between versions, changes made to an activated version may not affect other versions.

A mechanism, such as a new version toolbox control 1455, may be provided whereby a new version may be created. A new version may be created from scratch (and subsequently filled with worksite properties). This may the case when an initial version is created by default as the first (and, at that point, only) version of a new project. Alternatively or additionally, a new version may inherit some solar installation project properties, such as project properties and feature classifications (if any exist) from a previous version. So, for example, if a set of features have been defined and classified, a newly-created version may inherit these features and classifications A mechanism, such as a version-copy toolbox control 1460, may also be provided whereby a version may be copied or duplicated. A new version may be created by being copied (e.g., branched off or duplicated) from a pre-existing layout or version. The currently-activated version may be used as the version from which the new version will be branched off. The new-copied version may start with all or most of the properties of its sibling version, e.g. same worksite properties, apertures and aperture properties, exceptions, and so forth, as when the duplicate version is initially populated with at least some of the same state information as the original version. Subsequent modifications to the newly-copied version may or may not be reflected in the original version, depending (as shown in FIG. 13) on whether the changes are to elements shared by the versions. In some embodiments, the user may make changes to the unique set of user-defined design preferences and feature properties corresponding to a new or duplicated version that are not reflected in the unique set of user-defined design preferences and feature properties corresponding to any version created before the new or duplicated version.

A mechanism, such as a version-delete toolbox control 1465, may be provided whereby a version may be deleted, e.g., removed from the display and, potentially, removed from storage associated with the version. A similar mechanism, e.g., version-rename toolbox control 1470, may be provided to rename versions.

Mechanisms may be provided to generate information particular to a version, or otherwise operate upon a version, such as parts-summary toolbox control 1475 to generate a parts summary (as in a .CSV file) of a version; a version-export toolbox control 1479 to save version information to another format, such as a database record or set of records; a version-simulate toolbox control 1485 to perform and/or generate simulation data regarding a version; a version-simulation-export toolbox control 1490 to store or export version simulation information, such as in a .CSV file; and so forth. Each of the foregoing may be applied to a currently activated version, a selected version or set of versions, or to all versions.

Figure 15:
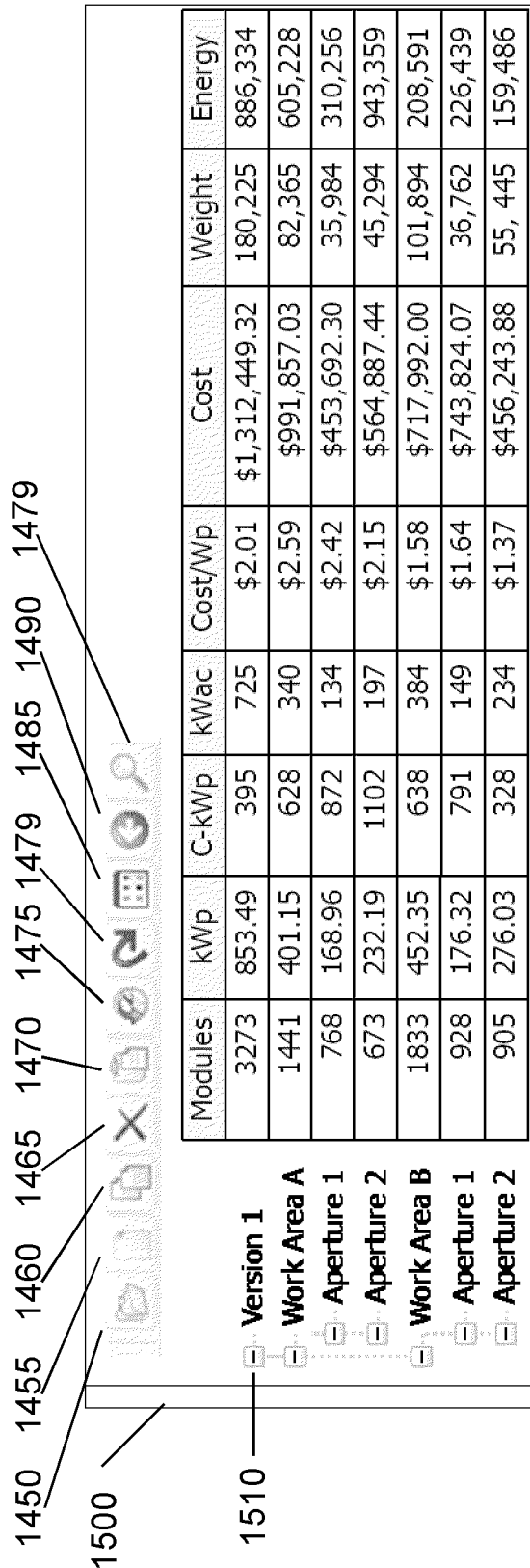
FIG. 15 schematically illustrates a portion of a version summary.

A control 1477 may also be used to generate a summary of the various versions of a project. This version summary may include a variety of types of comparative information about each of the versions, including layout information, such as solar collector count, cost, weight, etc.; simulation data, such as expected performance, peak power, cost per kilowatt-hr generated, minimum energy productions, etc.; and other types of information, such as exception count and types, etc. Information about illegal and deficient or otherwise poorly-placed modules in a version may be noted in a version summary. Version summary information may also be generated about information for each version such as projected performance, simulation information, electrical power, power efficiency, cost, materials, physical size, part count, and exceptions. This information may also be generated and displayed for sub-elements of a particular version, such as work area, apertures, sub-array, modules, strings, and so forth. FIG. 15 illustrates a sample version summary 1500 in which several versions 1510 have been summarized. A designer may use version summary information for many purposes, including to select among various versions and/or to identify errors or inefficiencies in versions. Version summary information may be exported to an external file or storage. A user may select which types of version summary information to display or export.

The various versions of an installation project may be stored in multiple files, or advantageously, in a single file. As with the single-version installation projects discussed above, a project with multiple versions may be represented in an XML-type format, wherein a top-level worksite node may contain a listing of features and their classifications. The worksite node may also contain a number of version nodes, which may, in turn, contain a number of work area and aperture nodes. Each aperture mode may contain sub-array nodes, and so forth. Data associated with a version, such as version summary information, name, and so forth, may be stored with the version. In particular, design output information that may vary from version to version, such as solar collector layout information, version summary information, simulation data, contract information, bill of material information, exception information, etc., may be cached or stored or co-located with a version.

In some embodiments, an "undo" control, such as toolbar icon or keyboard shortcut, may be provided to allow a designer to undo one or more changes to a project and/or to a version. In some embodiments, when a designer makes a change to a version, whether it be a modification of a layout, a classification of an object, etc., that change may be recorded by the embodiment. A control may then allow the user to "undo" the change by reversing its effect. In some embodiments, the change may be recorded by taking a snapshot of the state of the project or version. The embodiment may undo the change by reverting back to the snapshot. Alternatively, an embodiment may record the state transition embodied by a change (or its inverse). Performing an "undo" may then be accomplished by reversing the state transition. In this way, multiple levels of undo may be maintained, as by the use of a snapshot or transition stack. Similarly, a redo function may be implemented, wherein an "undo" action causes a snapshot or transition for the inverse ("redo") action, such as by pushing the inverse of the "undo" onto a redo stack.

8. Illustrative Examples

Figure 16A:
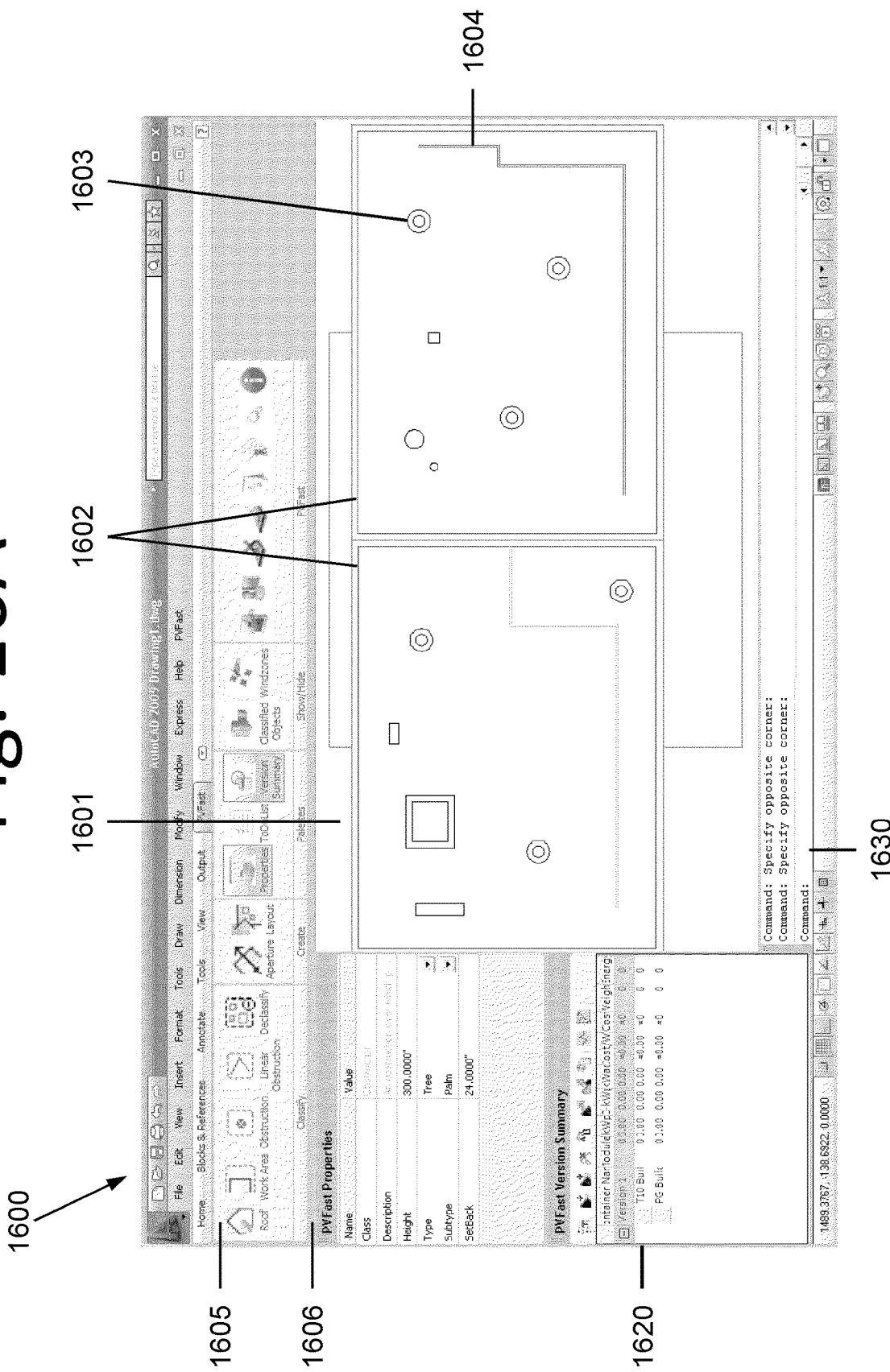
FIG. 16A provides a screenshot of another illustrative user interface in which a user may classify geometric objects and in a which to display PV module layout, which may be generated according to feature properties, project properties, layout rules, and design preferences.

FIGS. 16A-E illustrate examples of screen shots from layout software in accordance with embodiment of some of the systems and methods described herein. FIG. 16A illustrates a user interface 1600 in which a visual representation 1601 of a worksite with geometric objects corresponding to two sloped roof surfaces meeting at a roof ridge 1602 contains a number of solid obstructions (vents 1603) and linear obstructions (pipes 1604). The user interface 1600 also includes toolbars 1605 and a properties palette 1606. The interface may include a version display (not shown), a version summary (1620), an exceptions list (not shown), fields 1630 for user input and system output, and may display the foregoing simultaneously.

Figure 16B:
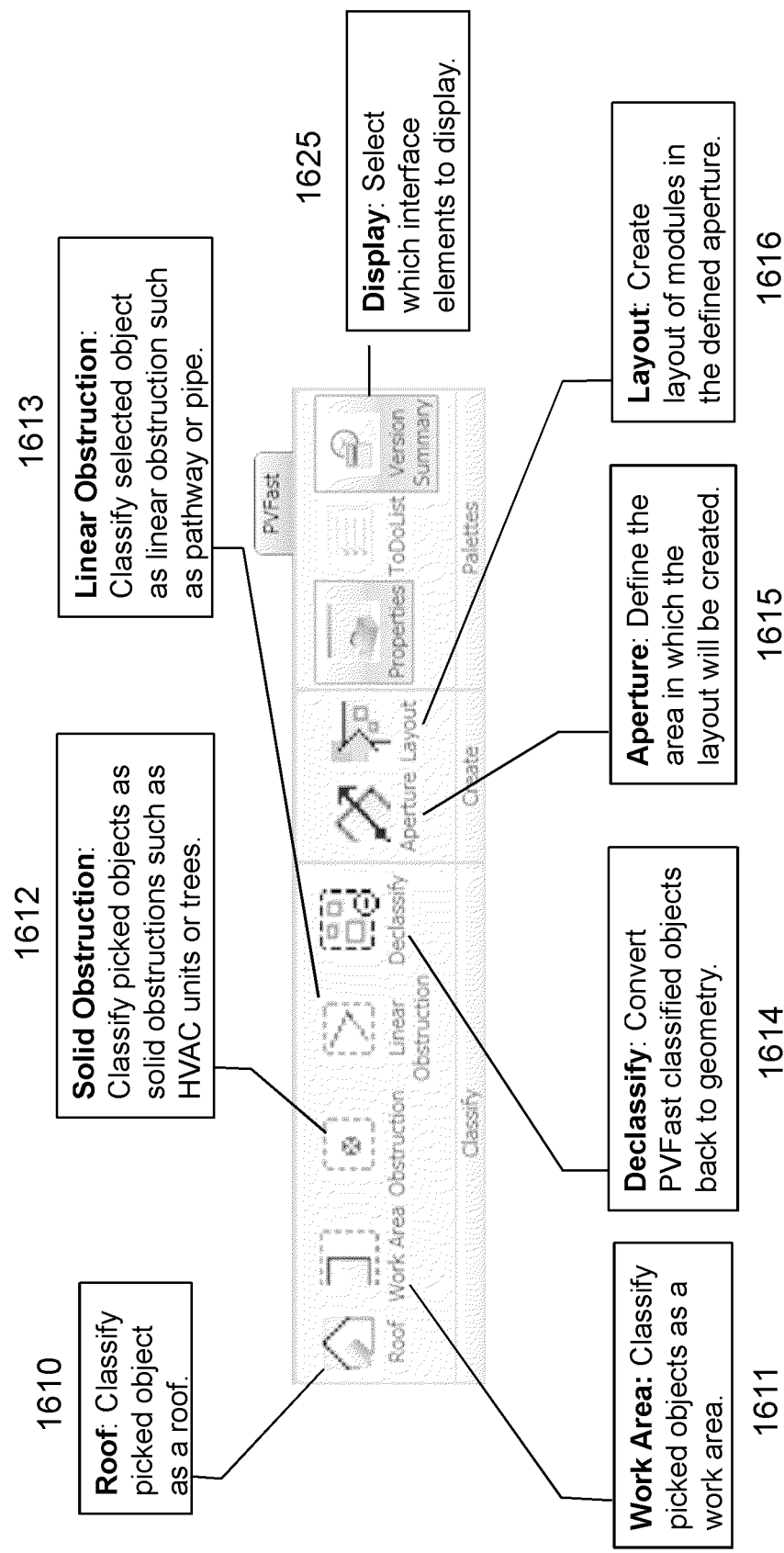
FIG. 16B provides a screenshot of an illustrative user interface providing toolbar controls for some functions related to classification and layout of PV modules.
Figure 16C:
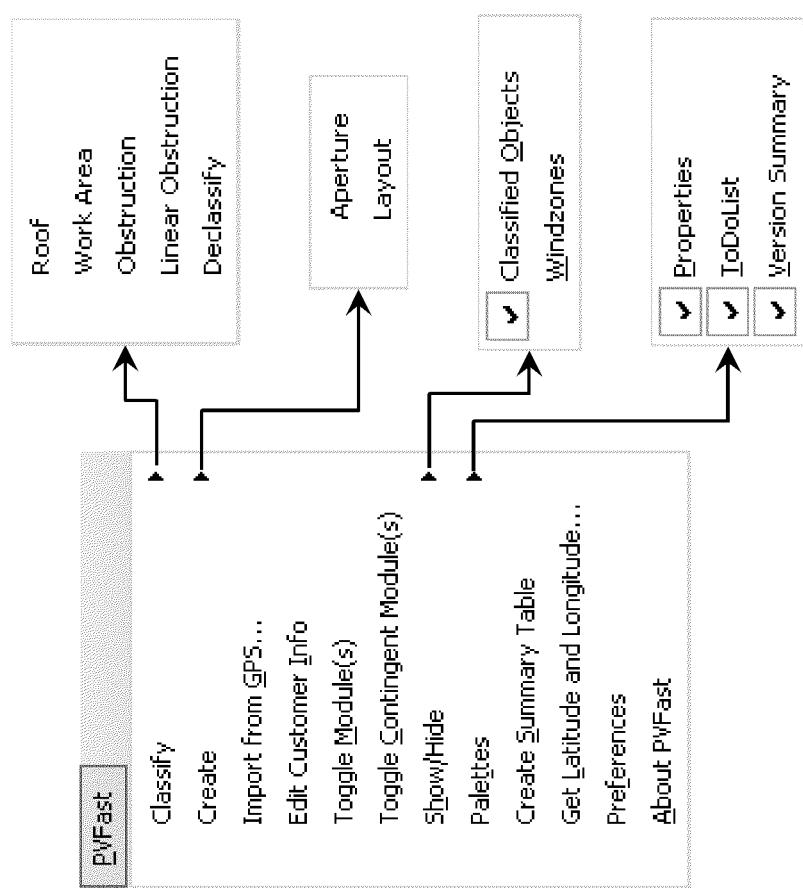
FIG. 16C provides a screenshot of an illustrative user interface providing menu controls for some functions related to classification and layout of PV modules.
Figure 16D:
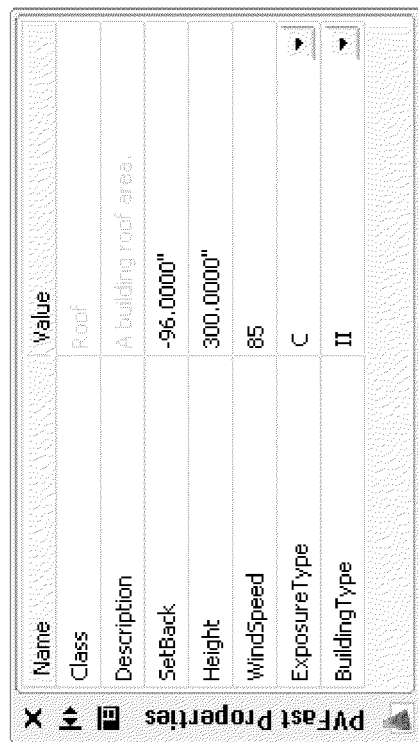
FIG. 16D provides a screenshot of an illustrative user interface providing a palette control for access and modification of feature properties, design preferences, and other user input.

As illustrated in FIG. 16B, controls in the form of a toolbar 1605 may provide a user with the ability to classify objects as features (here illustrated as a roof control 1610, solid obstruction control 1612, and linear obstruction control 1613) and to create work area boundaries 1611 in the visual representation, the work areas defining an extent into which solar modules may be placed. A control to declassify 1614 an object may be provided. A control to create layout apertures 1615 may be provided, along with a control to generate 1616 an actual layout. A display control 1625 may be provided to select which interface elements to display, such as an exceptions list, properties palate, version summary, version list, etc. The layout may be substantially limited to the intersection of the work areas' boundaries and the apertures' boundaries and the layout may be generated at least in part according to the sets of design preferences associated with the apertures. As shown, helpful (but non-limiting) text may be provided with controls in the form of popups, rollovers, etc. As shown in FIG. 16C, a menu containing controls to accomplish many of the same functions may also be provided. As illustrated in FIG. 16D, a properties palette may allow a user to see and/or adjust the properties relating to a particular feature.

Figure 16E:
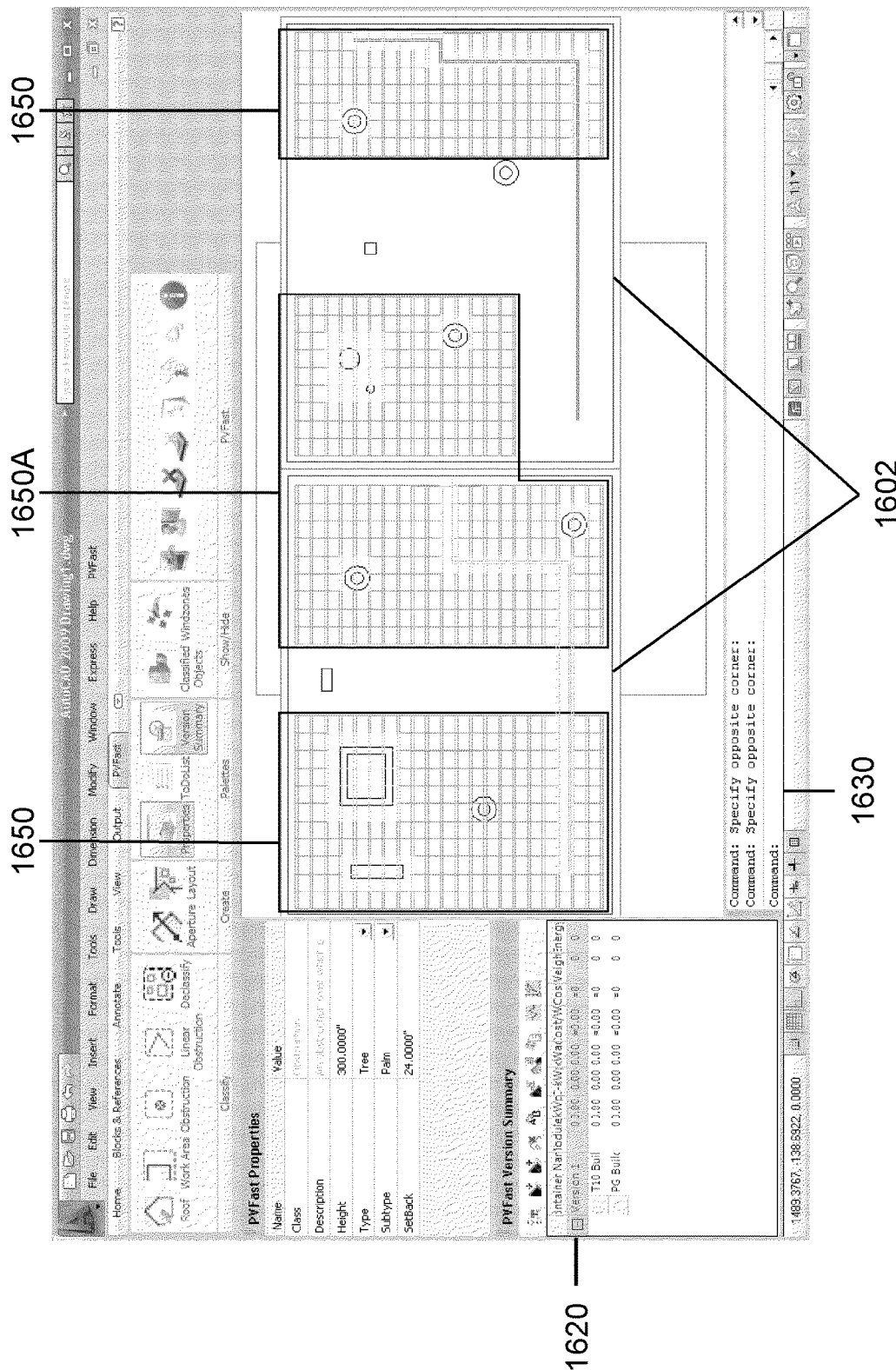
FIG. 16E provides a screenshot of the illustrative user interface of FIG. 10A in which a PV module layout has been generated according to, user inputs (e.g., feature properties, project properties, design preferences), and layout rules (e.g., layout constraints, environmental factors, local building codes, etc.).

FIG. 16E illustrates the result of generating a layout for PV modules on a visual representation containing two roof objects 1602, two work area boundaries largely co-extensive with each roof surface, and three aperture boundaries (two of which are rectangular-shaped apertures 1650 extending over only a portion of one roof and one work area, and one of which is an irregular-shaped aperture 1650A extending over a portion of two roofs and work areas). As shown, each aperture has a set of modules placed within, consistent with the layout rules regarding the respective roof, work area, and obstructions contained within.

9. Conclusion

Those of skill in the art will recognize that the foregoing descriptions of categorization and rules are merely indicative of some methods of practicing the inventions as defined by the appended claims. Other methods of laying out PV modules within and around geometric objects based on layout requirements associated with a worksite may be used to accomplish similar ends, such as tables, scripts, data structures, etc. Rules may be explicit and/or comprise declarative statements, as described above or as used in a rule-centric language, such as LISP; alternatively, one or more "rules" may be expressed implicitly in data structures, imperative statements, program flow, program constructs, placement and arrangement algorithms, etc. Rules are used herein as one way of illustrating the general method by which a tool may use information associated with arbitrary objects to create a PV module layout. A particular rule, such as a layout constraint, may be explicitly associated with a particular object or feature and/or a particular type or class of feature; such a rule may be defined as part of a layout engine and implicitly linked to objects or classes.

The systems, methods, and techniques described here may be implemented in computer hardware, firmware, software, or in combinations of them. A system embodying these techniques may include appropriate input and output components, a computer processor, and a computer program product tangibly embodied in a machine-readable storage component or medium for execution by a programmable processor. A process embodying these techniques may be performed by a programmable processor executing a program of instructions to perform desired functions by operating on input data and generating appropriate output. The techniques may advantageously be implemented in one or more computer programs that are executable on a programmable system including at least one programmable processor coupled to receive data and instructions from, and to transmit data and instructions to, a data storage system, at least one input component, and at least one output component. Each computer program may be implemented in a high-level procedural or object-oriented programming language, or in assembly or machine language if desired; and in any case, the language may be a compiled or interpreted language. Suitable processors include, by way of example, both general and special purpose microprocessors. Generally, a processor will receive instructions and data from a read-only memory and/or a random access memory. Storage components suitable for tangibly embodying computer program instructions and data include all forms of non-volatile memory, including by way of example semiconductor memory components, such as Erasable Programmable Read-Only Memory (EPROM), Electrically Erasable Programmable Read-Only Memory (EEPROM), and flash memory components; magnetic disks such as internal hard disks and removable disks; magneto-optical disks; and Compact Disc Read-Only Memory (CD-ROM disks). Any of the foregoing may be supplemented by, or incorporated in, specially-designed ASICs (application-specific integrated circuits). A representation of each of the various data structures and steps of methods described herein may be advantageously rendered, e.g., displayed or printed, on a device, e.g., a screen, monitor, or printer.

Although this disclosure describes certain embodiments and applications, other embodiments and applications that are apparent to those of ordinary skill in the art, including embodiments and applications which do not provide all of the features and advantages set forth herein, are also within the scope of the disclosure. Moreover, all lists and descriptions of options and alternatives are to be construed as exemplary and not limiting; lists have been used to aid explanation and are not an attempt to name all possible alternatives. The scope of the present invention is intended to be defined only by reference to the claims.

TABLE I

Sample of Information Output Dependent on Project Design

| Outputs # | Typical Solar Project Development Steps |
|---|---|
| 1 | Site Conditions |
| 2 | Design Schematics |
| 3 | Construction Drawings and Details |
| 4 | Part List |
| 5 | Bill of Materials |
| 6 | Construction Project Schedule |
| 7 | Costs Estimate |
| 8 | Financial Analysis |
| 9 | Energy Simulation |
| 10 | Proposal |
| 11 | Quote |
| 12 | Presentation |
| 13 | Contracts |
| 14 | Subcontracts |
| 15 | Sales Order |
| 16 | Rendering |
| 17 | Statement of Values |
| 18 | Rebate Application |
| 19 | Permit Application |
| 22 | Warranty |
| 23 | O&M Manuals |

TABLE II

Sample Steps In Solar Project Design

| Step # | Step |
|---|---|
| 1 | Gather customer information |
| 2 | Perform site audit |
| 3 | Select mounting system types |
| 4 | Select module type |
| 5 | Layout modules |
| 6 | Design electrical system |
| 7 | Generate bill of materials |
| 8 | Estimate system cost |
| 9 | Simulate energy output |

TABLE II-continued

Sample Steps In Solar Project Design

| Step # | Step |
|---|---|
| 10 | Perform financial analysis |
| 11 | Create schedule |
| 12 | Generate proposal |
| 13 | Negotiate contract terms |
| 14 | Create final design |
| 15 | Create final drawing set |
| 16 | Create final bill of materials |
| 17 | Procure materials |
| 18 | Award subcontracts |
| 19 | Finance projects |
| 20 | Obtain permits |
| 21 | Mobilize & stage project |
| 22 | Monitor project |
| 23 | Operate & maintain project |

TABLE III

Sample Feature Classes

| Class Object | Can inherit from . . . |
|---|---|
| Solid Obstruction | Object |
| Linear Obstruction | Object |
| Roof | Object |
| Antenna | Solid Obstruction |
| Conduit | Linear Obstruction |
| Drain | Solid Obstruction |
| Equipment Pad | Solid Obstruction |
| Expansion Joint | Linear Obstruction |
| General | Object |
| Guy Line | Linear Obstruction |
| HVAC | Solid Obstruction |
| Parapet Wall | Linear Obstruction |
| Penthouse | Solid Obstruction |
| Pole | Solid Obstruction |
| Roof Hatch | Solid Obstruction |
| Roof Shot | Solid Obstruction |
| Satellite | Solid Obstruction |
| Skylight | Solid Obstruction |
| Sleepers | Linear Obstruction |
| Stairs | Solid Obstruction or Linear Obstruction |
| Survey Point | Object |
| Tree | Solid Obstruction |
| Vent | Solid Obstruction |
| Walkway | Linear Obstruction |
| Wall | Linear Obstruction |
| Water Valve | Solid Obstruction |

TABLE IV

Sample Feature Properties

| Class | Properties |
|---|---|
| Object | Name |
| | Description |
| Solid Obstruction | Height |
| | Setback |
| | Type |
| | Subtype |
| | Coordinates |
| | Area |
| Linear Obstruction | Width |
| | Height |
| | Setback |
| | Type |
| | Subtype |
| | Coordinates |
| | Area |

TABLE IV-continued

Sample Feature Properties

| Class | Properties |
|---|---|
| Roof | Height |
| | Setback |
| | Wind Speed |
| | Building Type |
| | Exposure Type |
| | Max Roof Load |
| | Pitch |
| | Coordinates |
| | Area |
| Antenna | Height |
| Conduit | Diameter |
| Drain | Diameter |
| Equipment Pad | Height |
| Expansion Joint | Material |
| Guy Line | Angle |
| HVAC | Height |
| Parapet Wall | Height |
| Penthouse | Height |
| Pole | Height |
| Roof Hatch | Height |
| Satellite | Height |
| Skylight | Height |
| Sleepers | Height and Width |
| Stairs | Width |
| Survey Point | Coordinates |
| Tree | Growth Rate |
| Vent | Height |
| Walkway | Width |
| Wall | Height |
| Water Valve | Coordinates |

TABLE V

Sample Design Preferences
Name

Module Type
Mounting System Type
Inter Row Spacing
Orientation
Starting Point
Off Set
Tilt
Direction
Aperture Priority
String Voltage

TABLE VI

Sample Project Design Properties
Name

Customer Name
Project Name
Project Address
Zip Code
Country
Zip Code
Country
Latitude
Longitude
Date
Opportunity Reference
Site Orientation (North angle)
Utility
Electric Tariff
Energy Usage
Maximum Demand
Entity Type

TABLE VI-continued

Sample Project Design Properties
Name

Tax Status
Tax Liability

TABLE VII

Sample Module Properties
Name

Manufacturer
Model
Peak Power
Rated Voltage
Rated Current
Open Circuit Voltage
Short Circuit Current
Maximum System Voltage
Temperature Coefficients
CEC PTC Rating
Height
Width
Length
Weight
Frame Type
Voltage
Current
Allowable Mounting Types
Interconnect
Cost
Front Glass
Warranty
Junction Box
Output Cables
Rated Temperature
Max Load
Impact Resistance
Certifications

What is claimed is:

1. An apparatus for designing a solar collector installation, comprising:
at least one processor configured to:
generate a displayable representation of an installation worksite on a user interface, the representation comprising feature properties corresponding to physical features of the worksite and a solar collector installation layout including solar collectors arranged on at least one surface feature of the worksite;
generate a plurality of differing versions of project state information of the worksite, wherein each of the differing versions includes design preferences, feature properties, and/or project properties, wherein each of the differing versions corresponds to an alternative solar collector installation layout, wherein the alternative solar collector installation layout for each of the differing versions results from differences between the design preferences, feature properties, and/or project properties, and wherein each of the differing versions shares at least some of the project state information;
receive a first user input from the user interface indicating a change to the design preferences, feature properties, and/or project properties, the change being recorded by taking a snapshot of one or more of the differing versions; and
receive a second user input from the user interface indicating undoing the change to the design preferences, feature properties, and/or project properties based on the snapshot.

2. The user interface of claim 1, wherein the shared project state information includes classifications of at least some geometric objects as instances of a feature type.

3. The user interface of claim 1, wherein the design preferences of a first version differs from the design preferences of at least one other version.

4. The user interface of claim 1, wherein the feature properties of each of the differing versions includes geometric object information.

5. The user interface of claim 1, wherein each of the differing versions includes feature classification information.

6. The user interface of claim 1, wherein the at least one processor is configured to create a new version of project state information.

7. The user interface of claim 6, wherein the at least one processor is configured to allow a user to make changes to the design preferences and feature properties corresponding to the new version that are not reflected in the design preferences and feature properties corresponding to any version created before the new version.

8. An apparatus for designing a solar collector installation, comprising:
   at least one processor configured to:
   generate a displayable representation of an installation worksite on a user interface, the representation comprising feature properties corresponding to physical features of the worksite and a solar collector installation layout including solar collectors arranged on at least one surface feature of the worksite;
   generate a plurality of differing versions of project state information of the worksite, wherein each of the differing versions includes design preferences, feature properties, and/or project properties, wherein each of the differing versions corresponds to an alternative solar collector installation layout, wherein the alternative solar collector installation layout for each of the differing versions results from differences between the design preferences, feature properties, and/or project properties, and wherein each of the differing versions shares at least some of the project state information;
   generate and display a comparative representation of the differing versions of project state information in the user interface;
   receive a first user input from the user interface indicating a change to the design preferences, feature properties, and/or project properties, the change being recorded by taking a snapshot of one or more of the differing versions; and
   receive a second user input from the user interface indicating undoing the change to the design preferences, feature properties, and/or project properties based on the snapshot.

9. The user interface of claim 8, wherein the comparative representation includes information selected from at least one of the group of projected performance, simulation information, electrical power, power efficiency, cost, materials, physical size, part count, and exceptions.

10. The user interface of claim 9, wherein the at least one processor is configured to allow a user to select which information from among at least two of the projected performance, the simulation information, the electrical power, the power efficiency, the cost, the materials, the physical size, the part count, and the exceptions to include in the comparative representation.

11. The user interface of claim 8, wherein the at least one processor is configured to undo a change to one or more of the differing versions, thereby reverting at least one state element of the one or more differing versions to a previous value.

12. The user interface of claim 11, wherein the at least one processor is configured to undo any change to the one or more of the differing versions.

13. The user interface of claim 11, wherein the at least one processor is configured to redo an undone change to the one or more of the differing versions.

14. An apparatus for designing a solar collector installation, comprising:
   at least one processor configured to:
   generate a displayable representation of an installation worksite on a user interface, the representation comprising feature properties corresponding to physical features of the worksite and a solar collector installation layout including solar collectors arranged on at least one surface feature of the worksite;
   generate a plurality of differing versions of project state information of the worksite, wherein each of the differing versions includes design preferences, feature properties, and/or project properties, wherein each of the differing versions corresponds to an alternative solar collector installation layout, wherein the alternative solar collector installation layout for each of the differing versions results from differences between the design preferences, feature properties, and/or project properties, and wherein each of the differing versions shares at least some of the project state information;
   receive a first user input from the user interface indicating a change to the design preferences, feature properties, and/or project properties, the change being recorded by taking a snapshot of one or more of the differing versions; and
   receive a second user input from the user interface indicating undoing the change to the design preferences, feature properties, and/or project properties based on the snapshot, wherein at least two of the differing versions each include design output information, and the design output information of a first version of the at least two of the differing versions differs from the design output information of at least one other version of the at least two of the differing versions.

15. The user interface of claim 14, wherein the design output information includes solar collector layout information, and the solar collector layout information of the first version differs from the solar collector layout information of the at least one other version.

16. The user interface of claim 14, wherein the design output information includes version summary information, and the version summary information of the first version differs from the version summary information of the at least one other version.

17. The user interface of claim 14, wherein the design output information includes simulation data, and the simulation data of the first version differs from the simulation data of the at least one other version.

18. The user interface of claim 14, wherein the design output information includes contract term information, and the contract term information of the first version differs from the contract term information of the at least one other version.

19. The user interface of claim 14, wherein the design output information includes bill of material information, and the bill of material information of the first version differs from the bill of material information of the at least one other version.

20. The user interface of claim 14, wherein the design output information includes exception information, and the exception information of the first version differs from the exception information of the at least one other version.

\* \* \* \* \*